(12) United States Patent
Yuan et al.

(10) Patent No.: US 12,332,539 B2
(45) Date of Patent: Jun. 17, 2025

(54) RECONFIGURABLE ALL-OPTICAL ACTIVATION FUNCTIONS HAVING NORMALIZED OUTPUT POWER

(71) Applicant: HEWLETT PACKARD ENTERPRISE DEVELOPMENT LP, Houston, TX (US)

(72) Inventors: Yuan Yuan, Milpitas, CA (US); Yiwei Peng, Houston, TX (US); Stanley Cheung, Milpitas, CA (US); Zhihong Huang, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/972,927

(22) Filed: Oct. 25, 2022

(65) Prior Publication Data

US 2024/0134247 A1   Apr. 25, 2024
US 2024/0231180 A9   Jul. 11, 2024

(51) Int. Cl.
*G02F 1/35* (2006.01)
*G02F 1/355* (2006.01)
(Continued)

(52) U.S. Cl.
CPC .......... *G02F 1/3517* (2013.01); *G02F 1/3503* (2021.01); *G02F 1/3556* (2013.01);
(Continued)

(58) Field of Classification Search
None
See application file for complete search history.

(56) References Cited

U.S. PATENT DOCUMENTS 7,805,026 B2 *  9/2010  Gill .......................... G02F 1/225
                                                             359/279
8,111,722 B1 *  2/2012  Maleki .................... G02F 1/353
                                                             372/18
(Continued)

FOREIGN PATENT DOCUMENTS

CN        111860822 A     10/2020
CN        113033797 A      6/2021
(Continued)

OTHER PUBLICATIONS

Amin, R., et al., "ITO-based electro-absorption modulator for photonic neural activation function," APL Materials, vol. 7, Issue 8, Aug. 15, 2019, pp. 081112-1-081112-11.
(Continued)

*Primary Examiner* — Rhonda S Peace
(74) *Attorney, Agent, or Firm* — Sheppard Mullin Richter & Hampton LLP

(57) ABSTRACT

Systems, devices, and methods are provided for all-optical reconfigurable activation devices for realizing various activations functions having normalized output power. The device and systems disclosed herein include an interferometer comprising a first branch formed of a first waveguide and a second branch formed of a second waveguide. A resonator cavity is coupled to the second first waveguide and at least one phase-shift mechanism is coupled to one of the second waveguide and the resonator cavity. The at least one phase-shift mechanism is configured to control biases of the interferometer to achieve a desired activation function at an output of the interferometer, and an optical amplification mechanism is coupled to the output of the interferometer and configured to add optical gain to the desired activation function.

17 Claims, 11 Drawing Sheets

(51) Int. Cl.
  *G02F 1/365* (2006.01)
  *H01S 5/34* (2006.01)
  *H01S 5/343* (2006.01)
(52) U.S. Cl.
  CPC ............ *G02F 1/365* (2013.01); *H01S 5/3412* (2013.01); *H01S 5/343* (2013.01)

(56) References Cited

U.S. PATENT DOCUMENTS

| | | | | |
|---|---|---|---|---|
| 8,923,700 | B2* | 12/2014 | Socci | H04J 14/021 398/85 |
| 10,657,440 | B2* | 5/2020 | Abel | G06N 3/0675 |
| 11,187,963 | B2* | 11/2021 | Huang | G02F 1/3517 |
| 11,733,455 | B2* | 8/2023 | Liang | G02F 1/035 385/3 |
| 2019/0065941 | A1 | 2/2019 | Yoo et al. | |
| 2021/0072784 | A1 | 3/2021 | Lin et al. | |
| 2021/0116781 | A1 | 4/2021 | Hughes et al. | |
| 2021/0278743 | A1* | 9/2021 | Huang | G02F 1/225 |
| 2021/0391694 | A1* | 12/2021 | Hayashi | H04B 10/505 |
| 2024/0134247 | A1* | 4/2024 | Yuan | G06N 3/067 |

FOREIGN PATENT DOCUMENTS

| | | |
|---|---|---|
| CN | 113298246 A | 8/2021 |
| CN | 113595649 A | 11/2021 |
| CN | 113673677 A | 11/2021 |

OTHER PUBLICATIONS

Descos, A., et al., "Heterogeneous O-band InAs/GaAs quantum-dot optical amplifier on silicon." In Asia Communications and Photonics Conference, Oct. 2021.

Gupta, D., "Fundamentals of Deep Learning—Activation Functions and When to Use Them?" retrieved from: https://www.analyticsvidhya.com/blog/2020/01/fundamentals-deep-learning-activation-functions-when-to-use-them/, Jan. 30, 2020, pp. 19.

Hu, Y., et al., "An advanced III-V-on-silicon photonic integration platform." Opto-Electronic Advances, vol. 4, Issue 9, Sep. 25, 2021, pp. 200094-1-200094-14.

Huang, Y., et al., "Programmable low-threshold optical nonlinear activation functions for photonic neural networks." Optics Letters, vol. 47, Issue 7, Apr. 2022, pp. 1810-1813.

Jha, A., et al., "Reconfigurable all-optical nonlinear activation functions for neuromorphic photonics." Optics Letters, vol. 45, Issue 17, Aug. 26, 2020, pp. 4819-4822.

Miscuglio, M., et al., "All-optical nonlinear activation function for photonic neural networks." Optical Materials Express, vol. 8, Issue 12, Nov. 21, 2018, pp. 3851-3863.

Nihmias, M.A., "A leaky integrate-and-fire laser neuron for ultrafast cognitive computing." IEEE journal of selected topics in quantum electronics, vol. 19, Issue 5, Apr. 12, 2013, pp. 12.

Noel, M.M., et al., "Growing cosine unit: A novel oscillatory activation function that can speedup training and reduce parameters in convolutional neural networks." arXiv preprint arXiv:2108.12943, vol. 2, Aug. 30, 2021, pp. 14.

Sharma, S., et al. "Activation functions in neural networks." Towards data science, vol. 4, Issue 12, Sep. 6, 2017, pp. 310-316.

Shastri, B.J., et al., "Photonics for artificial intelligence and neuromorphic computing." Nature Photonics, vol. 15, Issue 2, Jan. 29, 2021, pp. 21.

Van, V., "Optical microring resonators: theory, techniques, and applications." CRC Press, 2017, pp. 81.

Williamson, I, AD., et al., "Reprogrammable electro-optic nonlinear activation functions for optical neural networks." IEEE Journal of Selected Topics in Quantum Electronics, vol. 26, Issue 1, Jul. 23, 2019, pp. 1-12.

Zuo, Y., et al., "All-optical neural network with nonlinear activation functions." Optica, vol. 6, Issue 9, Aug. 29, 2019, pp. 1132-1137.

* cited by examiner

COMPUTING COMPONENT 1100

HARDWARE PROCESSORS 1102

MACHINE-READABLE STORAGE MEDIA 1104

ADJUSTING A FIRST BIAS OF AN INTERFEROMETER INCLUDED IN THE NONLINEAR ACTIVATION DEVICE BY CONTROLLING A FIRST PHASE-SHIFT MECHANISM COUPLED TO A FIRST BRANCH OF THE MZI TO TUNE A PHASE DIFFERENCE BETWEEN THE FIRST BRANCH AND A SECOND BRANCH OF THE MZI 1106

↓

ADJUSTING A SECOND BIAS OF A RESONATOR CAVITY, COUPLED TO A SECOND BRANCH OF THE INTERFEROMETER, SUCH THAT THE NONLINEAR ACTIVATION DEVICE FUNCTIONS AT APPROXIMATELY A RESONANCE FREQUENCY OF THE RESONATOR CAVITY BY CONTROLLING A SECOND PHASE-SHIFT MECHANISM COUPLED TO THE RESONATOR CAVITY 1108

↓

TUNING A VOLTAGE BIAS APPLIED TO A SEMICONDUCTOR OPTICAL AMPLIFIER COUPLED TO AN OUTPUT OF THE INTERFEROMETER BASED ON THE PHASE DIFFERENCE BETWEEN FIRST BRANCH AND THE SECOND BRANCH OF THE INTERFEROMETER TO TUNE AN AMPLITUDE OF THE OUTPUT OF THE INTERFEROMETER 1110

FIG. 11

RECONFIGURABLE ALL-OPTICAL ACTIVATION FUNCTIONS HAVING NORMALIZED OUTPUT POWER

STATEMENT OF GOVERNMENT RIGHTS

This invention was made with Government support under Agreement No. H98230-18-3-0001. The Government has certain rights in the invention.

BACKGROUND

Driven by growing interest in artificial intelligence (AI), the global artificial neural network market is projected to grow at a significant rate. Artificial neural networks (ANN) and machine learning algorithms have the ability to learn from large data sets, which can create a machine having human-like decision making capabilities with low latency and high energy efficiency. Compared to electronic systems, neuromorphic photonics demonstrate improved performance in terms of multiplexing, energy dissipation, and crosstalk, which are beneficial for dense and high-bandwidth interconnects. Consequently, the neuromorphic photonic systems potentially offer operating speeds that are several orders of magnitude faster than neuromorphic electronics, along with higher efficiency.

ANNs are computing systems inspired by biological neural networks. The systems consist of a collection of connected nodes or neurons. Each neuron includes linear weights, a summation, and a nonlinear activation, which is a building block in ANNs that enables complex mappings between inputs and outputs for learning tasks. Several nonlinear activation functions, such as sigmoid, radial-basis, rectified linear unit (ReLU), and quadratic functions to name a few, are widely used in ANNs for different machine learning tasks.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 11 is an example computing component that may be used to implement various features of all-optical nonlinear activation devices in accordance with the implementations disclosed herein.

Figure 1:
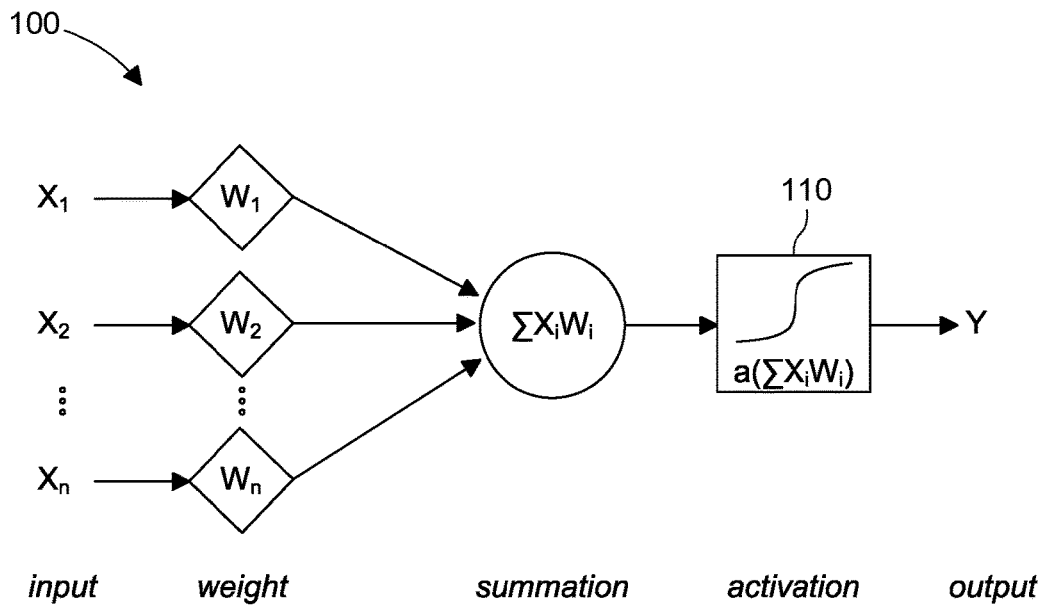
FIG. 1 illustrates a model of an example nonlinear neuron, which includes synapses, weighted addition, and a nonlinear activation function in accordance with implementations disclosed herein.

The figures are not exhaustive and do not limit the present disclosure to the precise form disclosed.

DETAILED DESCRIPTION

As described above, ANNs and machine learning algorithms have the ability to learn from large data sets to create human-like machines. A neuron of an ANN consists of a linear weighting of inputs, summation and a nonlinear activation function that achieves complex mappings between inputs and outputs for learning. Example nonlinear activation functions include, but are not limited to, sigmoid, radial-basis, ReLU (such as ReLU, inverse ReLU, and leaky ReLU), and quadratic functions, each of which is used in signal processing for different machine learning tasks. The various nonlinear activation functions are suitable for different tasks in neural networks and machine learning applications. For example, ReLU functions can provide for solving nonlinear optimization problems with constraints, and can be used in feedforward machine learning networks, such as multi-layer perceptron and convolutional neural networks. Other examples include radial-basis functions used for multi-layers based on support vector machines and quadratic functions used to simulate higher-order polynomial neural networks.

In order to achieve nonlinear activation, various approaches have been applied. Generally, these approaches can be divided into two types—an optoelectronic approach, and an all-optical approach. In optoelectronic approaches, nonlinear schemes integrated with photodetectors have been demonstrated based on a silicon microring modulator, a Mach-Zehnder modulator (MZM), an electro-absorption modulator, and a laser. However, these optoelectronic approaches are all subject to technical shortcomings, for example, all these approaches require efficient and fast optic-electro-optic (O-E-O) conversion. These requirements almost always lead to increased system complexity and additional power consumption from electronic devices, such as complementary metal-oxide-semiconductor (CMOS) field effect transistors.

With the development of nonlinear optics, some all-optical methods of implementing activation functions have been proposed. However, the optical nonlinearities are relatively weak, and thus all optical activation devices generally require high threshold power and large optical injection (e.g., input optical signal into the device). Another technical shortcoming of conventional all-optical methods is that the activation devices are generally fixed following fabrication, and therefore are not configurable to achieve different activation functions. That is, the conventional activation devices are generally fabricated for a single activation function, and cannot be switched (e.g., configured) for a different activation function.

Some implementations use a microring resonator (MRR) combined with phase change material (PCM) to change transmission versus power and realize the nonlinear activation function. However, the speed is limited due to the constraints in the PCM. A germanium/silicon (Ge/Si) hybrid microring structure has been used to generate an activation function based on the strong thermal-optic effect of germanium; however, the thermal process remains slow.

Figure 2:
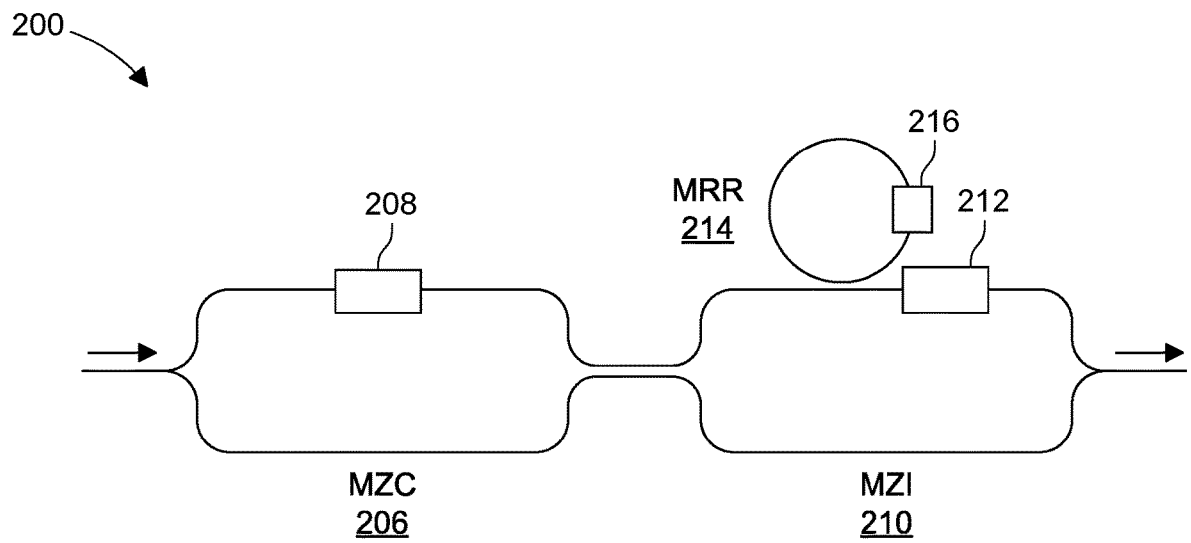
FIG. 2 depicts a schematic diagram of an all-optical nonlinear activation device.

An all-optical scheme on a silicon photonic platform has been demonstrated, such as the all-optical activation device shown in FIG. 2, which uses a Si microring resonator (MRR) loaded Mach-Zehnder interferometer (MZI) device utilizing the free-carrier dispersion (FCD) effect of Si to provide for nonlinearity. By exploiting the FCD effect of Si, an all-optical nonlinear activation function can be obtained. However, the nonlinearity of Si is weak and requires a high optical power intensity within the MRR.

Figure 5A:
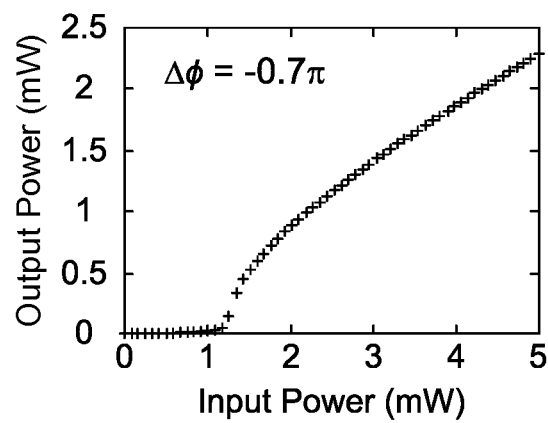
FIGS. 5A-5G illustrate optical power output from a resonator-assisted Mach-Zehnder interferometer at various phase differences for realizing different activation functions in accordance with implementations disclosed herein.
Figure 5B:
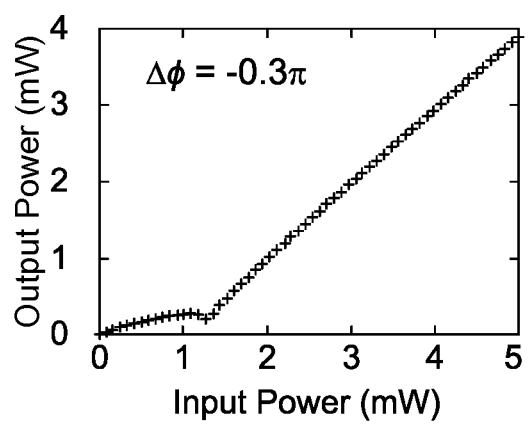
Figure 5C:
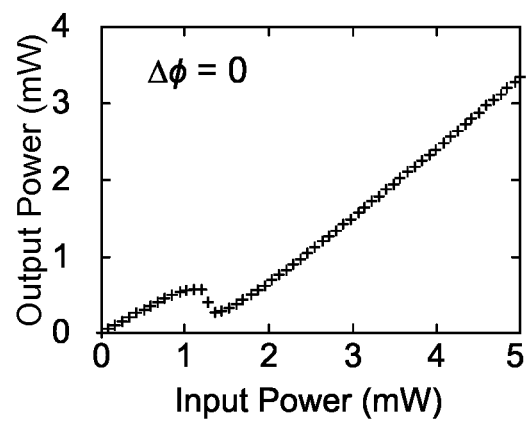
Figure 5D:
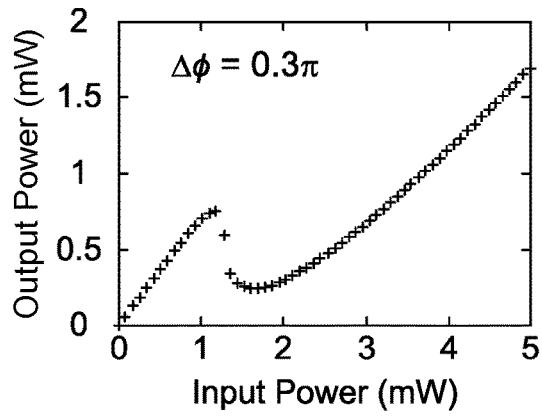
Figure 5E:
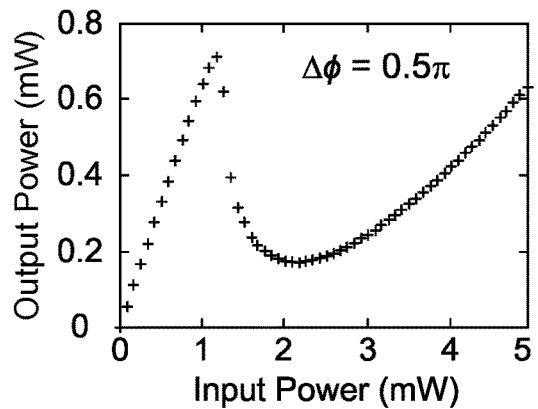
Figure 5F:
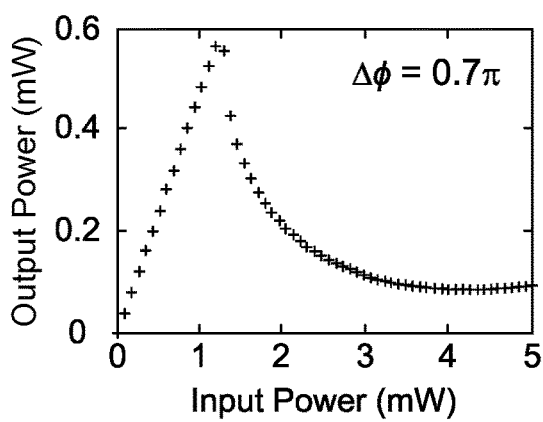

Furthermore, the magnitude of output optical power varies significantly across different activation functions, hindering practical applications. For example, activation functions map a resulting value in some range. In the case of a Sigmoid activation function and Gaussian activation function, both have outputs in a range from 0 to 1. However, when activation functions are implemented as the all-optical device shown in FIG. 2, the magnitude of the output power can change depending on the activation function. For example, the magnitude of the output power may be 7× greater for one activation function compared to another (for example, as described in connection with FIGS. 5A-5B). Thus, the outputs of the one activation may be equivalent to adding an unwanted multiplication factor (e.g., 7×) to the activation function. As a result, the activation function mapping from the reconfigured activation function is not usable because are skewed by the unwanted multiplication factor, which will affect the training results by propagating the skewed mapping into the training results.

Accordingly, implementations disclosed herein provide for devices and methods for all-optical reconfigurable activation functions that overcome shortcomings of prior approaches. The implementations disclosed herein utilize a silicon-on-insulator (SOI) platform, which is heterogeneous, to output an optical power that is normalized across various diverse activation functions. By exploiting the FCD effect of a SOI platform, reconfigurable all-optical nonlinear activation functions can be realized. Furthermore, through normalizing the output optical power across the various diverse activation functions, removing the unwanted multiplication factor and increasing the usability of the mapping provided by each activation function.

In some example implementations, a resonator cavity-loaded interferometer MZI is coupled to a semiconductor optical amplifier (SOA). The resonator cavity may be implemented as an MRR and the interferometer may be implemented as an MZI according to various implementations. The interferometer and resonator cavity are formed of materials having FCD induced nonlinearity, such as silicon. The nonlinearity provided by the MRR results in optical power-dependent transmission and phase, while optical interference from the interferometer provides for reconfigurability of activation functions by controlling the relative phase difference between branches of the interferometer. For example, controlling the relative phase difference between each branch provides for configurability between radial-basis, quadratic, ReLU, inverse ReLU, and leaky ReLU for different task applications.

Due to optical interference from the interferometer, each activation function is output at different output optical powers. For example, certain activation functions are output at low optical power, while other activation functions are output at high optical power. To achieve normalized output power across various nonlinear activation functions, an optical signal output from the interferometer can be supplied to the SOA, which provides for adjustable optical gain. The SOA, according to various implementations, can be based on bonded Group III-V layers, for example, an optically active material can be used as an optical gain medium with gain that can be induced by applying a voltage bias across the SOA. Example optically active materials include, but are not limited to, quantum dot, quantum wells, quantum-dash structures, or any structure that can create carrier population inversion for optical gain.

Furthermore, according to various implementations, the interferometer and/or the resonator cavity may include one or more phase-shift mechanisms, which can be provided as a heater, metal oxide-semiconductor (MOS) phase shifter, PN junction phase shifter, PIN junction phase shifter, or the like. The phase-shift mechanisms provide for the programmability of the nonlinear function shape through tunning of relative phase differences within the structure. The phase-shift mechanism may be provided as any mechanism capable of inducing a phase shift in an optical signal propagating through the respective waveguide.

Accordingly, the implementations disclosed herein provide for an all-optical reconfigurable approach to realize nonlinear activation functions having normalized output optical powers across various diverse activation functions. The disclosed implementations can be used directly in neuromorphic photonics without O-E-O conversion of an optoelectronic approach. Furthermore, the disclosed implementations can be implemented using a hybrid heterogenous Group III-V material on Si integration platform. Accordingly, other components for neuromorphic photonics, such as lasers, weight banks, and photodiodes to name a few, can be fully integrated with the disclosed implementation at the wafer scale based on such integration. As a result, the disclosed implementations can be fully compatible with heterogeneous photonic integrated circuits (PICs) without any additional processing.

Additionally, the reconfigurable activation functions disclosed herein can be achieved by tuning a phase of light propagating in one branch of the resonate cavity-loaded MZI, wherein conventional approaches relied on multiple tunable phases to achieve reconfigurability. Thus, numerous nonlinear activation functions can be realized (such as, but not limited to, ReLU, Leaky ReLU, cosine-like, radial-basis, and Sigmoid-like) in a much simpler and efficient means, e.g., without requiring a preceding MZC.

It should be noted that the terms "optimize," "optimal", and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

As used herein "approximately" and "generally" refer to permissible variations in properties of the implementations disclosed herein. Implementations disclosed herein may have certain properties, attributes, and/or characteristics that include some acceptable variation that does not significantly affect the functioning of the disclosed implementations.

FIG. 1 illustrates an example neuron 100 of an ANN, where the inputs (e.g., $X_1$ to $X_n$) into the neuron are a linear combination (weighted addition) of the output of other neurons. This neuron applies weights (e.g., $W_1$ to $W_n$) to the input signals, aggregates (e.g., summation) the weighted signals over time, and produces a nonlinear response Y, which is represented by an activation function 110. The activation function 110 may be implemented according to implementations disclosed herein, e.g., as described in connection with FIG. 3. The neuron's output is then broadcast to successive neurons in the ANN. Note that the inter-neuron connections can be weighted with positive and negative values represented as excitatory and inhibitory synapses, respectively. The synaptic interconnection network of neurons can be represented as a matrix of the weight values ($w_{ij}$) or real numbers. Moreover, the coding scheme will map the real-valued weights and represent them as spiking signals.

FIG. 2 depicts a schematic diagram of an all-optical nonlinear activation device 200. The activation device is an example physical implementation of activation function 110 of FIG. 1. The activation device 200 comprises a Mach-Zehnder Coupler (MZC) 206 coupled to a Mach-Zehnder Interferometer (MZI) 210. The MZC 206 comprises two branches, each of which may be implemented as waveguides to guide the propagation of light (e.g., an optical signal such as a lasing mode). The MZC 206 includes a first phase-shift mechanism 208 coupled to one of the branches. The MZI 210 also comprises two branches, each of which may be implemented as waveguides to guide the propagation of light (e.g., an optical signal such as a lasing mode). The MZI 210 also includes a second phase-shift mechanism 212 and an MRR 214, each of which is coupled to one of the branches of the MZI 210. The MRR 214 includes a third phase-shift mechanism 216 coupled to a waveguide for the MRR 214.

In operation, MZC 206 functions as a tunable coupler to adjust the input power ratio of an optical signal supplied to the branches of MZI 210. The MRR 214 exhibits nonlinearity based on a Kerr effect and free carrier dispersion (FCD) effect induced nonlinearity. Nonlinearity from the MRR 214 is output via MZI 210. First phase-shift mechanisms 208, 212, and 216 can be controlled to provide tuning of the amplitude and phase of the devices, and together the desired activation function can be programmed.

In various implementations, the activation device is a silicon-based device, where the MZC 206, MZI 210, and MRR 214 comprise waveguides formed of silicon. The silicon-based activation device 200 exploits the FCD effect to produce nonlinearity. However, this approach results in a weak nonlinearity effect and requires a high optical input into the MRR 214. As used herein, a weak nonlinear effect corresponds to a weak nonlinear refractive index ($n_2$), which means nonlinearity due to the Kerr effect is weak and the required input optical power is high. For example, a weak nonlinear refractive index ($n_2$) (e.g., weak Kerr effect) refers to a material having a nonlinear refractive index ($n_2$) that is at least less than $2.6 \times 10^{-17}$ $m^2/W$ (e.g., nonlinear refractive index ($n_2$) of aluminum gallium arsenide (AlGaAs)). In an example implementation, a weak nonlinear refractive index ($n_2$) refers to a material having a nonlinear refractive index ($n_2$) that is equal to or less than $4.5 \times 10^{-18}$ $m^2/W$ (e.g., the nonlinear refractive index ($n_2$) of Si). Furthermore, the magnitude of output optical power varies significantly across different activation functions, which hinders practical applications.

While the above example describes the activation device as a silicon-based device and using Si to form the waveguides of the MZC 206, MZI 210, and MRR 214, other implementations are possible. For example, the waveguides disclosed herein may be formed from materials having stronger nonlinear refractive index ($n_2$), such as AlGaAs, or weaker nonlinear refractive index ($n_2$), such as tantalum pentoxide (e.g., $Ta_2O_5$ having a nonlinear refractive index ($n_2$) of $7.2 \times 10^{-19}$ $m^2/W$) or silicon nitride (e.g., $Si_3N_4$ having a nonlinear refractive index ($n_2$) of $2.4 \times 10^{-19}$ $m^2/W$).

Figure 3:
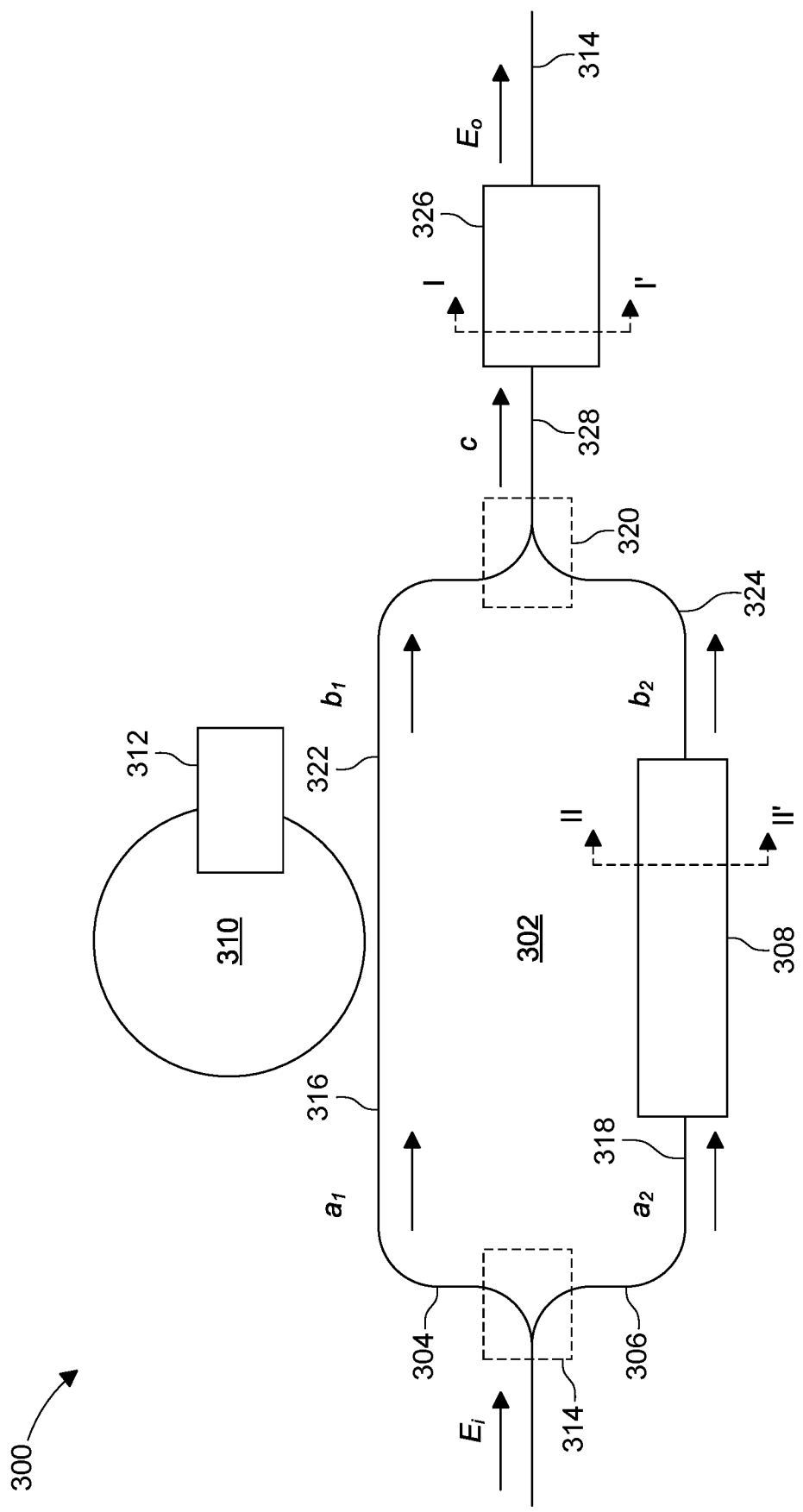
FIG. 3 depicts a schematic diagram of an all-optical nonlinear activation device in accordance with implementations disclosed herein.

FIG. 3 depicts a schematic diagram of the all-optical nonlinear activation device 300 in accordance with implementations disclosed herein.

The activation device 300 includes an input end that receives an input optical signal $E_i$ and an output end that transmits an output optical signal $E_o$. In some implementations, the input end and/or output end may comprise an optical coupler configured to receive the input optical signal $E_i$ and/or output optical signal $E_o$. Activation device 300 comprises a Mach-Zehnder Interferometer (MZI) 302 that receives the input optical signal $E_i$. The MZI 302 comprises first branch 304 and second branch 306. The MZI 302 may be implemented as one or more waveguides that guide the propagation of light (e.g., an optical signal such as a lasing mode). For example, first branch 304 may be formed of a first waveguide and second branch 306 may be formed of a second waveguide. The MZI 302 includes at least a first phase-shift mechanism 308 in one of the branches 304 and 306, and at least one resonator cavity 310 (illustratively depicted as a microring resonator or MRR) optically coupled to the other of branches 306 and 304. In the illustrative example shown in FIG. 3, the first phase-shift mechanism 308 is provided along branch 306 and the resonator cavity 310 is provided along branch 304. However, the first phase-shift mechanism 308 may be provided along either branch of the MZI 302 as long as the resonator cavity 310 is provided along the other branch. Additional MRRs may be included in the other branch, or multiple MRRs may be included in one branch, depending on the implementation. The resonator cavity 310, in some implementations, may include a second phase-shift mechanism 312.

The phase-shift mechanisms 308 and 312 are configured to alter a phase of an optical signal propagating therein. Phase-shift mechanisms 308 and 312 may be provided as any mechanism capable of inducing a phase shift in light propagating through a respective waveguide (particular examples of the phase-shift mechanism are provided below in greater detail). In the illustrative example of FIG. 3, first phase-shift mechanism 308 can be controlled to tune a relative phase difference between branch 304 and branch 306 by inducing a phase shift in branch 306. Second phase-shift mechanism 312 can be controlled to tune a resonance frequency of the resonator cavity 310 by inducing a phase shift in a resonance cavity (e.g., waveguide) of the resonator cavity 310. By tuning relative phase differences within the activation device 300, the phase-shift mechanisms 308 and/or 312 functions as tunable elements configured to efficiently change biases of the activation device 300, which enables the device 200 to be programmed to achieve desirable activation functions for different applications (as described below in connection with FIGS. 5A-5G). For example, tuning one or more of the phase-shift mechanisms 308 and/or 312 provides for switching between different activation functions. Thus controlled tuning of phase-shift mechanisms 308 and/or 312 provides for configuring the activation device into a desired activation function, which can be subsequently changed through control of phase-shift mechanisms 308 and/or 312. The activation device 300 can achieve these functions with high accuracy because the tunable elements can be precisely controlled by an automated control system (e.g., implemented as computer system 1200 of FIG. 12).

According to various implementations, an optical splitter/coupler 314 is provided at the input end of MZI 302 for coupling input optical signal E; into MZI 302. The optical splitter/coupler 314 may be implemented as a Y-splitter for splitting the input optical signal E; into each branch 304 and 306 according to a splitting ratio of the optical splitter/coupler 314. For example, optical splitter/coupler 314 splits input optical signal $E_i$ into first optical signal $a_1$ that propagates in a first section 316 of branch 304 and a second optical signal $a_2$ that propagates in a first section 318 of branch 306. The relative optical power of the first and second signals $a_1$ and $a_2$ is dependent on the splitting ratio of the optical splitter/coupler 314. The splitting ratio of optical splitter/coupler 314 may be any desired ratio. In the illustrative examples provided herein, the optical splitter/coupler 314 is a 50:50 Y-splitter having a splitting ratio of 1, which means the optical power of the first and second signals $a_1$ and $a_2$ is approximately the same (e.g., 50% of input optical signal $E_i$ is guided into branch 304 and 50% is guided into branch 306). According to various implementations, the splitting ratio of the optical splitter/coupler 314 is fixed.

The split optical signals propagate through branch 304 and branch 306, respectively, and are combined by another optical splitter/coupler 320. The optical splitter/coupler 320 may be substantially similar to the optical splitter/coupler 314. However, optical splitter/coupler 320 functions to receive optical signal $b_1$ propagating in section 322 of branch 304 and optical signal $b_2$ propagating in section 324 of branch 306 as inputs, and combines the optical signal $b_1$ and $b_2$ to output optical signal c onto section 328 of the waveguide. Optical splitter/coupler 320 may have any desired splitting ratio. In this example, the optical splitter/coupler 320 is a 50:50 Y-splitter having a fixed splitting ratio.

Optical signal $a_1$ is optically coupled into resonator cavity 310, for example, through evanescent coupling based on a coupling coefficient between the waveguide of the first section 316 and the waveguide of the resonator cavity 310. According to various implementations disclosed herein, the waveguides forming the MZI 302 and the waveguide forming the resonator cavity 310 are made from the same material, for example, silicon or another Group IV material (e.g., germanium, silicon carbide, silicon germanium, and so on). However, the waveguides forming the MZI 302 and/or resonator cavity 310 may be made from other materials, such as but not limited to, AlGaAs, $Ta_2O_5$, $Si_3N_4$, etc. In other implementation, the activation device 300 may be formed on a platform other than a Si-based platform, for example, a SiN-based platform and the like.

In the resonator cavity 310, when an optical signal therein is near the resonance frequency, the optical signal experiences a power-dependent nonlinear phase shift that varies rapidly with its optical power. In addition, the resonator cavity 310 can also increase the effective interaction length and instantaneous optical power through coherent power buildup, therefore reducing the required optical power supply. Phase-shift mechanisms 312 can be controlled to tune the resonance frequency. The MZI 302 is used to convert the phase change from the resonator cavity 310 into an intensity change with a large extinction ratio. With a properly tuned phase difference, interference between optical signals propagating in the two branches of the MZI 302 can switch from constructive to destructive, leading to self-switching. Accordingly, loading at least one branch of the MZI 302 with resonator cavity 310, as shown in FIG. 3, provides for configurability between different activation functions by the all-optical nonlinear activation device 300. Additional resonator cavities may be provided to support and/or assist with this switching effect. Thus, while multiple resonator cavities are possible, at least one branch is loaded with at least one resonator cavity to achieve the desired effects.

To maximize the switching effect, a low power signal can be switched off through destructive interference. Ideal destructive interference requires signals traveling in the two branches of the MZI 302 to have equal amplitudes and an exact $\pi$ phase difference. As noted above, the optical splitter/coupler 314 may be implemented with a splitting ratio of one, thereby providing approximating equal amplitudes of the optical power supplied to each branch 304 and 306. The MZI 302 bias can be independently tuned via phase-shift mechanisms 308 to introduce a $\pi$ phase difference to achieve destructive interference. The bias on the resonator cavity 310 also can be adjusted to ensure that the activation device 300 is operating approximately at the resonance wavelength to achieve the optimal sensitivity (e.g., highest possible sensitivity).

The dynamic response of the activation device 300 can be simulated based on rate equations and coupled-mode theory as set forth below. The dynamic equations can be simplified with energy amplitude of the optical signal in the resonator cavity 310 (e.g., change of amplitude over time calculated as $$\frac{da}{dt}\bigg)$$

and free carrier (FC) density N (e.g., change in FC density over time calculated as $$\frac{dN}{dt}\bigg):$$

$$\frac{da}{dt} = -j(\Delta\omega + \Delta\omega_{NL})a - (\gamma_L + \gamma_{NL})a - j\mu\sqrt{P_{in}} = \quad \text{Eq. 1}$$
$$-(j\Delta\omega + \gamma_L)a - j\eta_k|a|^2 a - j\eta_{fc} Na - j\mu\sqrt{P_{in}}$$

$$\frac{dN}{dt} + \frac{N}{\tau_{fc}} = \xi|a|^4 \quad \text{Eq. 2}$$

Where j represents an imaginary value; $\Delta\omega_{NL}$ represents the nonlinear frequency shift of the resonator cavity 310; $\Delta\omega$ represents detuning between the frequency of the input optical signal and the resonance frequency of the resonator cavity 310; $\gamma_L$, $\gamma_{NL}$, $\mu$, and $\tau_{fc}$, represents linear decay rate which is proportional to propagation losses, nonlinear decay rate, coupling coefficient for resonator cavity 310, input power, and free carrier lifetime (e.g., 0.5 ns in some examples), respectively; $\eta_k$, $\eta_{fc}$ and $\xi$ relate to the Kerr effect coefficient, free carrier dispersion (FCD) effect coefficient, and two-photon absorption (TPA) coefficient, respectively; a represents a field amplitude in the resonator cavity 310; $|a|^2$ represents the power in the resonator cavity 310; N represents the free carrier density in the resonator cavity 310. In Eq. 1, $(-j\Delta\omega+\gamma_L)$ a represents a linear effect and $j\eta_k|a|^{2a}-j\eta_{fc}Na$ represents a nonlinear effect.

The Kerr effect coefficient $(\eta_k)$ and TPA coefficient $(\xi)$ are determined as follows:

$$\eta_k = \left(\frac{n_c}{n_r}\right)^2 \left(n_2 k_0 - \frac{j\beta}{2}\right) \frac{v_g}{A_{eff} T_{rt}} \qquad \text{Eq. 3}$$

$$\eta_{fc} = \frac{n_c}{n_r}\left(\sigma_r k_0 - \frac{j\sigma_a}{2}\right) v_g \qquad \text{Eq. 4}$$

$$\xi = \left(\frac{n_c}{n_r}\right)^2 \frac{\beta}{2\hbar\omega A_{eff}^2 T_{rt}^2} \qquad \text{Eq. 5}$$

Where $v_g$ represents group velocity; $T_{rt}$ represents the round trip time in a resonator cavity; $n_c$ represents the core refractive index; $n_r$ mode effective index; $n_2$ represents the nonlinear refractive index; $\beta$ represents the absorption coefficient; A eff represents the effect mode area (for example, 0.13 um²); $k_0$ represents the wavenumber; $\sigma_r$ represents the free carrier refraction volume (for example, $-2.2\times10^{-26}$ m³); $\sigma_a$ represents the free carrier absorption cross section ($6.72\times10^{-22}$ m²).

According to Eqs. 1 and 2, intensity-dependent nonlinearity arises from the Kerr effect (also called the quadratic electro-optic (QEO) effect, which is a change in refractive index of a material in response to an applied electric field, such as irradiance by a light source in the case of an optical Kerr effect), FCD effect, and/or TPA effect. As shown in Eq. 1, the nonlinear effect includes a first portion dependent on the Kerr effect coefficient $(\eta_k)$ and a second portion dependent on the FCD effect coefficient $(\eta_{fc})$ and the FC density (N), which is dependent on the TPA coefficient $(\xi)$ as shown in Eq. 2. The Kerr effect coefficient $(\eta_k)$ is proportional to the nonlinear refractive index $(n_2)$ and the TPA coefficient $(\xi)$ is proportional to the two photon absorption coefficient (a 2).

The resonance frequency of resonator cavity 310 redshifts (e.g., decreases in frequency and photon energy while increasing in wavelength) when the Kerr effect dominates because $n_2>0$, while the FCD effect is in opposite direction because the FC volume is negative. In the case of a resonator cavity 310 formed of a silicon waveguide, the FCD effects dominates over the relatively weak nonlinearity induced Kerr effect of silicon. The TPA, which depends on the absorption coefficient (β), generates free carriers and gives rise to the FCD effect. The nonlinearity of the silicon resonator cavity leads to an optical power-dependent response and, as a result, to a nonlinear transfer function in the resonator cavity-loaded MZI.

Figure 4:
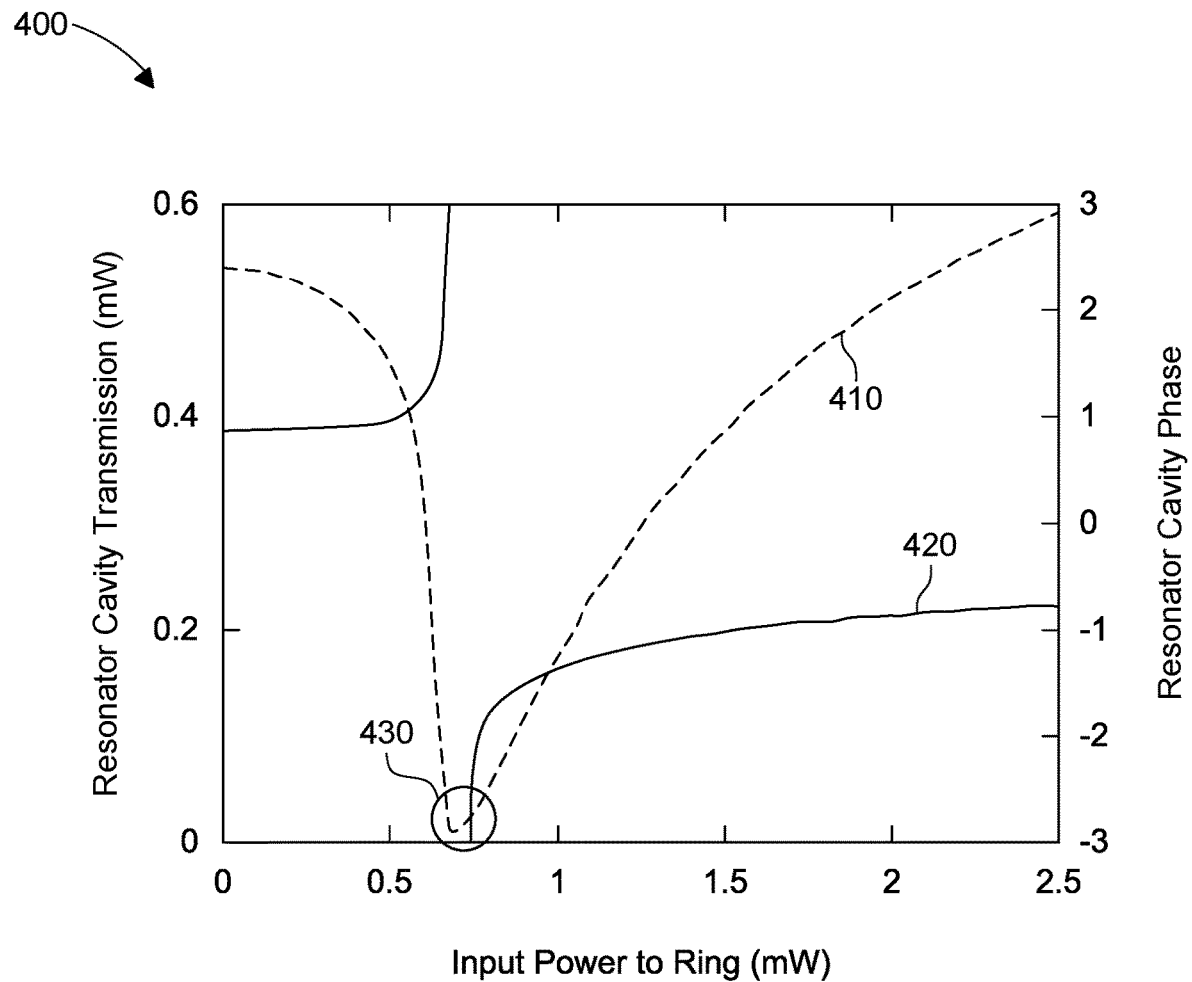
FIG. 4 is a graphical representation of optical power and phase of an optical signal transmitted from a resonator cavity, in accordance with the implementation disclosed herein, plotted against optical power input into the resonator cavity.

FIG. 4 is a graphical representation of optical power and phase of an optical signal transmitted from resonator cavity 310 plotted against optical power input into the resonator cavity 310. Plot 400 was generated by simulating resonator cavity 310 to transmit optical signal $b_1$ (e.g., output from resonator cavity 310) as a function of input optical power of optical signal $a_1$ supplied to resonator cavity 310. The x-axis of plot 400 provides the values of the optical power input into resonator cavity 310, which is varied from 0 to 2.5 mW. Line 410 depicts transmitted optical power of optical signal $b_1$ as a function of the input optical power, with values of transmitted optical power shown on the left side y-axis of plot 400. Line 420 depicts phase of optical signal optical signal bras a function of input optical power, with values of phase shown on the right-side y-axis of plot 400.

The resonator cavity 310 was simulated as a MRR formed of a Si waveguide. In the example simulation, light propagating in resonator cavity 310 has a wavelength of 1310 nm, the resonator cavity 310 has a radius of 6 μm and propagation loss of approximately 13 dB/cm, Kerr effect coefficient $(n_2)$ of the Si waveguide is approximately $2.34\times10^{-18}$ m²/W and the TPA coefficient (β) is approximately $13.34\times10^{-12}$ m/W, and the wavelength detuning (Δλ) induced via control of phase-shift mechanism 312 is approximately 24.8 pm. Plot 400 shows that that transmitted optical power and phase are dependent on the input optical power. For example, as shown in plot 400, a discontinuous point 430 occurs at approximately 0.7 mW of input optical power, at which point the transmitted power is at a minimum and the phase undergoes a discontinuous jump at resonance of the MRR. The Q factor of the simulated MRR is approximately 9000. Consequently, the thermal effect of the simulated MRR may not be an issue at an input optical power of approximately 0.7 mW.

The phase discontinuity at point 430 is due to the nonlinearity of the material of the resonator cavity 310 (e.g., silicon in this example), which can be exploited to program the activation function by optical interference. As described above, with reference to FIG. 3, a phase-shift mechanisms 308 is provided on the branch 306 of MZI 302. By tuning the phase of light propagating in branch 306, the output of the MZI 302 can exhibit constructive and/or destructive interference at different optical power input into the resonator cavity 310. Exploiting the constructive and/or destructive interference through control of the input optical power, provides a fully reconfigurable activation function as described above.

For example, as described above, the power ratio of optical signal input into branch 304 and branch 306 of the MZI 302 and the wavelength detuning (AA) of resonator cavity 310 can be fixed values. Thus, programmability of the activation function can be realized by tuning the phase-shift mechanisms 308 on the branch 306 of MZI 302, which can be tuned to provide a phase difference between branch 304 and branch 306. The phase difference (Δϕ) is the difference between the phase of the optical signal $b_1$ propagating in section 322 ($\phi_1$) and the phase of the optical signal $b_2$ propagating in section 324 ($\phi_2$) (e.g., $\Delta\phi=\phi_1-\phi_2$).

Figure 5G:
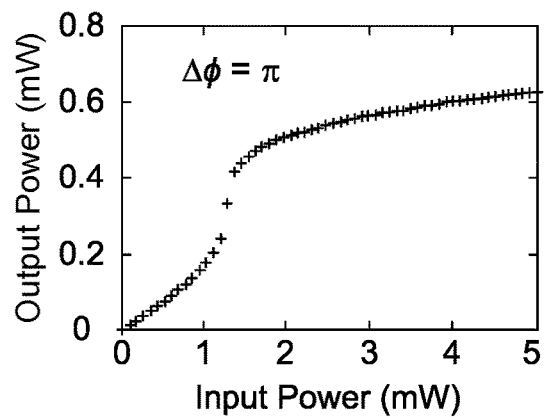

FIGS. 5A-5G illustrate the optical power output from the MZI 302 (e.g., optical signal c) at various phase difference (Δϕ), thereby realizing different activation functions. For example, FIGS. 5A-5G depict simulated output optical powers as a function of optical power input into the MZI 302 (e.g., optical signal $E_i$), where the Δϕ is tuned to −0.7π, −0.3π, 0, 0.3π, 0.5π, 0.7π, and π, respectively. The input optical power is varied from 0 to 5 mW, which corresponds to the 0 to 2.5 mW input optical power of FIG. 4 due to optical splitter/coupler 314. Accordingly, as shown in FIGS. 5A-5G, various activation functions can be obtained by selectively tuning Δϕ, such as ReLU (FIG. 5A), Leaky ReLU (FIG. 5B), Swish-like (FIG. 5C), modified ReLU (FIG. 5D), cosine-like (FIG. 5E), radial-basis (FIG. 5F), and Sigmoid-like (FIG. 5G).

The programmability of activation functions (e.g., reconfigurability to implement distinct nonlinear operations) as disclosed herein, can be useful for applying neural networks to different problems. For example, ReLU is a commonly used activation function as of recently, leaky ReLU is useful for networks with dead neurons, cosine-like oscillatory functions can improve gradient flow and alleviate the vanishing gradient problem, radial-basis is can be used for function approximation and pattern recognition, and Sigmoid function generally works better in classifiers.

While nonlinearity of the resonator cavity 310 provides for input optical power-dependent transmission and phase and optical interference of the MZI 302 provides for selectability of a desired activation function from a number of activation functions, due to the optical interference the magnitude (or amplitude) of the optical power output from the MZI 302 (e.g., magnitude of the optical power for optical signal c of FIG. 3) varies from one activation function to another. As can be seen in FIGS. 5A-5G, the magnitude of the optical power output for each function varies from one to the next. For example, the radial-basis function shown in FIG. 5F has an output optical power of less than 0.6 mW at a maximum, while the Leaky ReLU of FIG. 5B has an output optical power of approximately 4 mW (e.g., almost 7× difference in output optical power).

To normalize the peak output power for different activation functions, the activation device 300 comprises a semiconductor optical amplifier (SOA) 326 (also referred to herein as an optical amplification mechanism) coupled to output end of the MZI 302. For example, the optical splitter/coupler 320 supplies optical signal c to the SOA 326 via section 328 of the waveguide. The SOA 326 is configured to add optical gain to the optical signal c through generation of light. The optical gain added by SOA 326 can be tuned to normalize the optical power of the activation device 300 (e.g., normalize the optical power of $E_i$). For example, referring to FIGS. 5A-5G, to achieve normalized peak output power for different activation functions, the SOA 326 can be implemented to add approximately 8.2 dB of optical gain (e.g., 4 mW divided by 0.6 mW).

For example, the SOA 326 is configured to generate an optical signal that is injected into section 328 of the waveguide based on properties of the SOA 326. As optical signal c propagates within section 328 of the waveguide, optical signal c functions as a seed signal for SOA 326, which causes the SOA 326 to emit additional light at the frequency of the optical signal c (e.g., akin to an optical feedback), thereby providing optical gain that amplifies the optical signal c. According to various illustrative implementations, the SOA 326 includes an optically active material, such as for example, quantum dots (QD), quantum wells (QW), quantum-dash structures, or any structure that can create carrier population inversion for optical gain in the waveguide. In these implementations, the additional light (e.g., the optical gain) is generated when a voltage bias is applied to the optically active material, thereby stimulating emission (e.g., photoluminescence), for example in the case of quantum dots, by the optically active material at a wavelength corresponding to the energy difference between conductance band and valence band or the transition between discretized energy states.

Figure 6:
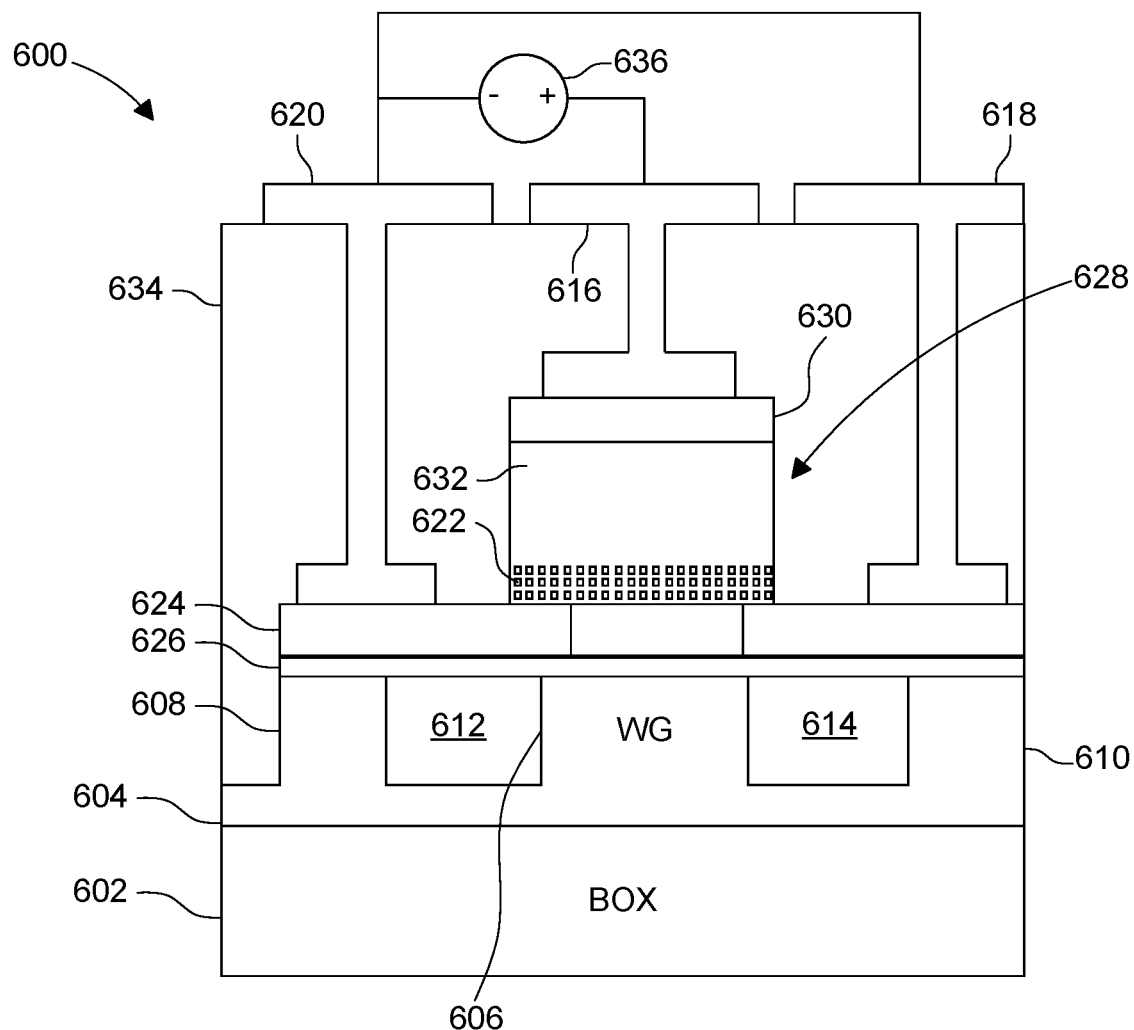
FIG. 6 illustrates an example semiconductor optical amplifier according to an implementation disclosed herein.

FIG. 6 illustrates an example SOA 600 according to an implementation disclosed herein. SOA 600 may be implemented as SOA 326 of FIG. 3 in some examples, in which case FIG. 6 illustrates a cross-section view of SOA 326 taken along cross-sectional line I-I' of FIG. 3. FIG. 6 depicts a buried oxide (BOX) layer 602 grown on a substrate (not shown), for example, such as a silicon dioxide layer. FIG. 6 also depicts a layer 604 of semiconductor material formed on the BOX layer 602. The semiconductor material layer 604 may be a silicon layer or layer of other materials. The semiconductor material layer 604 comprises a waveguide 606 and support structures 608 and 610 separated from each other via air trenches 612 and 614 (e.g., an air trench or air gap). The waveguide 606 may be an example implementation of section 328 of a waveguide of FIG. 3. Structures 608 and 610 can be formed for supporting outer edges of the SOA 600. The trenches 612 and 614 may function to confine the optical mode within the waveguide 606 in the lateral direction. The BOX layer 602 may be provided to confine the optical mode in a longitudinal direction (e.g., into the layers provided on the BOX layer 602).

As described above, the SOA 600 is configured to generate light that is injected into the waveguide 606. Light propagating in the waveguide 606 may be used as seed signal for the SOA 600. Light may be generated by the SOA 600, for example, by applying a voltage bias between contact electrode 616 and 618/620 (e.g., via power source 636 controlled by a computing device, such as computing system 1200 of FIG. 12), which causes an optically active medium 622 to photoluminescent and inject light into the waveguide 606. The voltage bias may be modulated to induce amplitude modulation of the photoluminescence and, as a result, the intensity of light propagating in the waveguide 606. Polarity of contact electrodes 618 and 620 may be the same (e.g., negative polarity contact electrodes), while the polarity of contact electrode 616 may be opposite (e.g., positive polarity contact electrode).

The SOA 600 includes a cathode 624 comprising a first material and a portion of which is formed on a side of the semiconductor material layer 604 opposite the BOX layer 602. The cathode 624 is bonded to at least the waveguide 606 via a bonding layer 626 and is electrically coupled to the contact electrodes 620 and 618. In some example implementations, bonding layer 626 may be a thin layer comprising oxides (e.g. $SiO_2$, $HfO_2$, $Al_2O_3$, or the like) formed as an interface between cathode 624 and waveguide 606. The bonding layer 626 may function as an interface between the waveguide 606 and the cathode 624 at which carrier concentration may change due to voltage bias applied to the electrodes 616 and 618/620.

The SOA 600 also comprises a mesa structure 628 formed on cathode 624. The mesa structure 628 is provided for generating light, which is provided to the waveguide 606 based on applying a voltage bias between contact electrodes 616 and 618/620. A bias applied to the mesa structure 628 may act to modulate optical gain added to the waveguide 606. The mesa structure 628 overlaps at least the waveguide 606 in a direction perpendicular to BOX layer 602. A passivation layer 634 is formed over the mesa structure 628, thereby encapsulating the mesa structure 628 as shown in FIG. 6 to provide for device passivation and pad isolation. The passivation layer 634 may be formed for silicon dioxide ($SiO_2$) or similar material as desired for the particular application.

The mesa structure 628 includes an anode 630 formed on a dopped semiconductor material layer 632, which is disposed on optically active medium 622 formed on the cathode 624. The contact electrode 616 is disposed on the anode 630 opposite the cathode 624 in the direction perpendicular to BOX layer 602. The dopped semiconductor material layer 632 comprises a second material that is dissimilar from the first material.

In various implementations, the cathode 624 comprises a layer of Group III-V material as the first material, such as gallium arsenide (GaAs), indium phosphide (InP), or other compounds of indium, gallium, phosphorus, and arsenic. The cathode 624 may be formed by, for example but not limited to, deposition, wafer bonding, monolithic growth, or other fabrication techniques. The anode 630 may comprise a layer of Group III-V material that is oppositely dopped from the cathode 624 as the second material. For example, the cathode 624 may be a negatively-doped material (e.g., a n-doped semiconductor layer comprising Group III-V material) as the first material, and the anode 630 may be a positively-doped material (e.g., a p-doped semiconductor layer comprising Group III-V material). In an illustrative example, the first material of the cathode 624 can be n-doped GaAs and the second material of the anode 630 can be p-doped GaAs.

As described above, the mesa structure 628 is configured to generate light and induce optical gain in the waveguide 606. For example, optical gain may be achieved by light-emission generated within the mesa structure 628, which produces light that can be injected into the waveguide 606. Optical gain may be achieved, for example, by biasing the optically active medium 622 to provide additional light that is added to light already propagating in the waveguide 606.

To achieve stimulated light emission, the optically active medium 622 is disposed in the doped semiconductor material layer 632 adjacent to the cathode 624. In some implementations, doped semiconductor material layer 632 may be grown to include optically active medium 622, such that the layers are monolithic. The optically active medium 622 may comprise, for example, quantum dot (QD), quantum wells (QW), quantum-dash (QD) structures, or any structure that can create carrier population inversion for optical gain as an optical gain medium. In an example, the optically active medium 622 may comprise InAs and/or GaAs QDs. The doped semiconductor layer 632 comprising the optically active medium 622 may be formed of a doped Group III-V material, such as AlGaAs or the like, which is doped to a polarity opposite to that of the cathode 624 (e.g., positively-doped Group III-V material).

To generate light, a forward voltage bias may be applied between the electrodes 616 and 618/620. The bias causes a carrier concentration change through accumulation that leads to stimulated emission in the optically active medium 622, thereby generating light. Emitted light traverses the layers and is injected into the waveguide 606, in which the light then propagates. Accordingly, by biasing the voltage applied between the electrodes 616 and 618/620, optical gain can be added to the waveguide 606 via mesa structure 628. The amount of optical gain may be modulated based on changing the magnitude of the voltage bias applied to the mesa structure 628.

While certain materials are described as negatively- or positively-doped, implementations are not limited thereto, and the polarity doping may be switched. For example, while the above example described the cathode 624 as negatively-doped and the anode 630 and doped semiconductor layer 632 as positively-doped, the polarity of each layer may be switched such that the cathode 624 can be positively-doped and the anode 630 and semiconductor layer 632 can be negatively-doped.

Figure 7A:
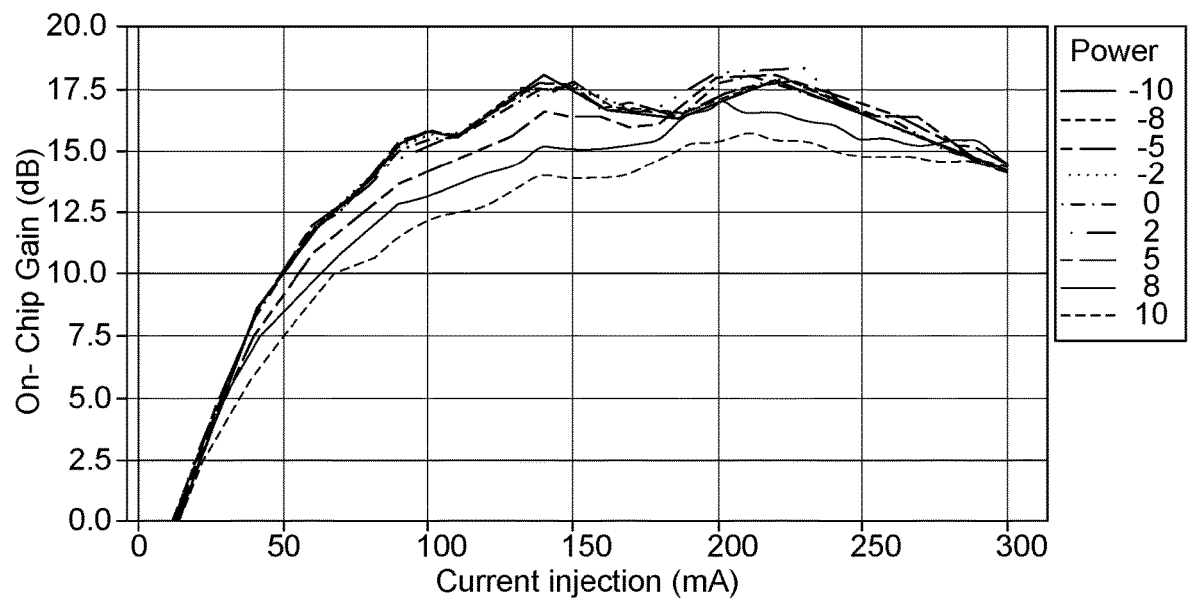
FIGS. 7A and 7B are plots illustrating the performance of the semiconductor optical amplifier of FIG. 6.
Figure 7B:
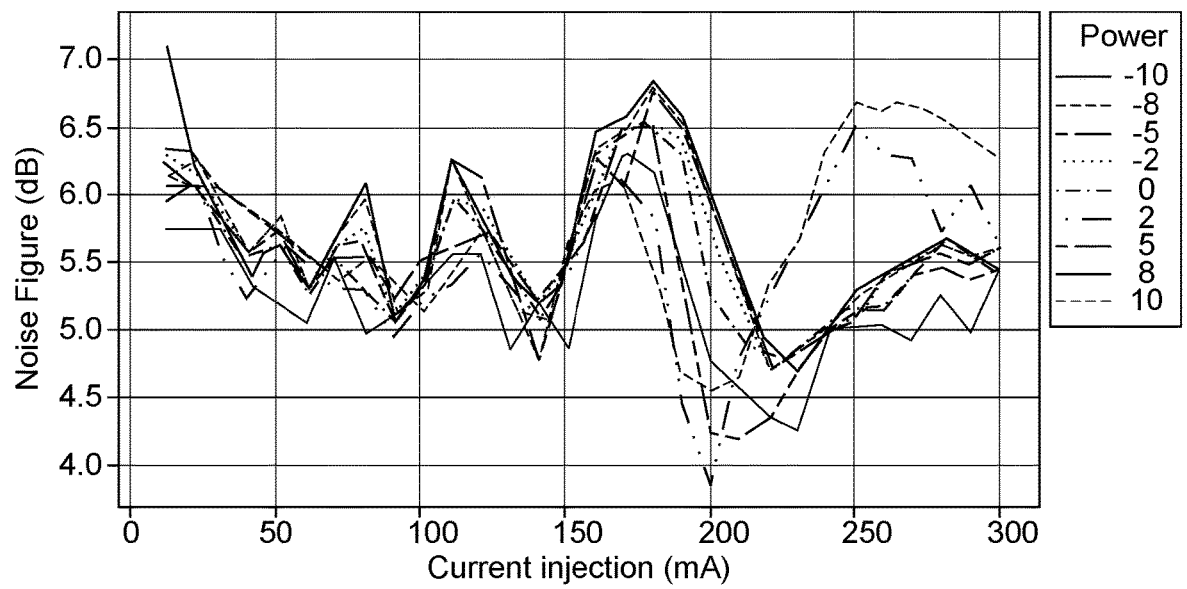

Accordingly, the SOA 600 may be implemented as a hybrid Si platform in which optically active medium 622 can be integrated into the SOI platform to provide optical gain. FIGS. 7A and 7B illustrate performance of the SOA 600 according to an implementation disclosed herein. FIG. 7A is a plot of optical gain as a function of current injection into SOA 600 via voltage bias applied between contact electrodes 616 and 618/620, for various input optical powers provided as dBm. FIG. 7B is a plot of noise as a function of current injection into SOA 600, for various input optical powers. As can be seen in FIGS. 7A and 7B, SOA 600 can be implemented to achieve more than 15 dB of gain, which is beyond the gain required for the resonator cavity 310 loaded MZI 302 of FIG. 3 (e.g., approximately 8.2 dB).

Figure 8:
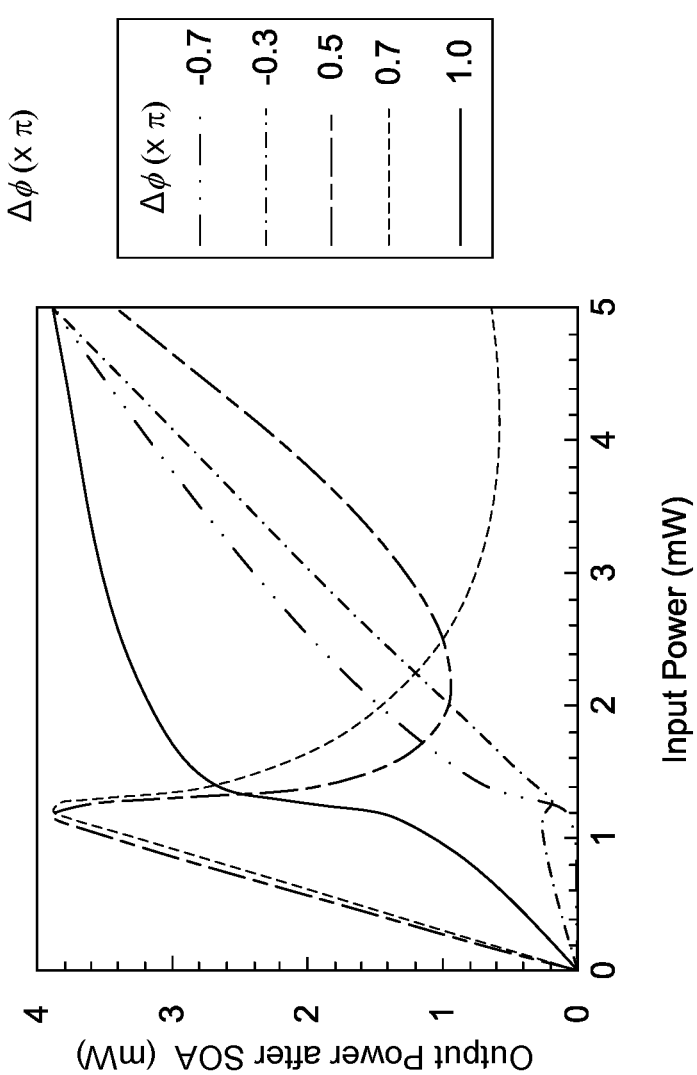
FIG. 8 is a graphical representation of optical power output from the all-optical nonlinear activation device of FIG. 3 plotted against optical power input into the all-optical nonlinear activation device of FIG. 3 in accordance with an implementation disclosed herein.

Accordingly, by adjusting the injection current (e.g., via voltage bias) of the SOA 600 for different activation functions, a reconfigurable all-optical activation function with normalized output can be accomplished as shown in FIG. 8. FIG. 8 is a graphical representation of optical power of optical signal ($E_o$) from output from SOA 326 of activation device 300 plotted against optical power input into the activation device 300 (e.g., optical power of optical signal ($E_i$)). In generating FIG. 8, SOA 326 was implemented using SOA 600. As shown in FIG. 8, the output optical power for each activation function realized at respective phases differences is normalized to approximately 4 mW with input optical power varied between 0 and 5 mW.

Phase tuning according to the implementations disclosed herein may be achieved through many different approaches. For example, phase-shift mechanisms described throughout the present disclosure, such as phase-shift mechanisms 308 and 312 of FIG. 3, may be provided as any mechanism capable of inducing a phase shift in light propagating through the respective waveguide. For example, as alluded to above, phase-shift mechanism 312 can be configured to tune the resonant frequency by inducing a change in the refractive index of a resonate structure (e.g., MMR 114) over a certain length, for example, through carrier injection (e.g., charge accumulation), charge depletion, or changing the temperature of a portion or all of the resonator structure. As another example, phase-shift mechanisms 308 may induce a phase shift within a branch of MZI 302 by inducing a change in the refractive index of a waveguide over a certain length, for example, through carrier injection (e.g., charge accumulation), charge depletion, or changing temperature of a portion or all of the resonator structure.

Figure 9:
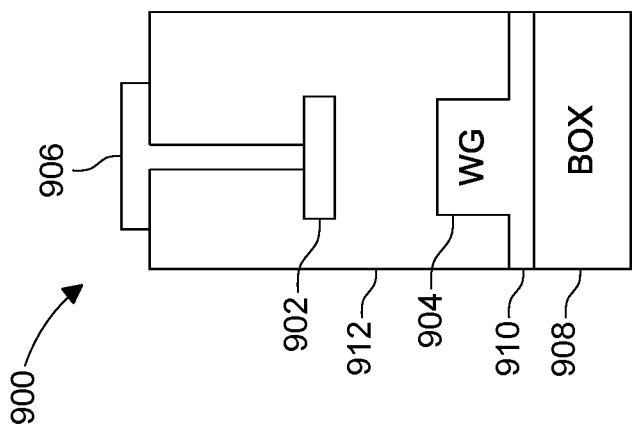
FIG. 9 illustrates an example phase-shift mechanism according to an implementation disclosed herein.

FIG. 9 illustrates an example phase-shift mechanism 900 according to an implementation disclosed herein. Phase-shift mechanism 900 may be implemented as phase-shift mechanisms 308 or phase-shift mechanisms 312 of FIG. 3. For example, FIG. 9 depicts a cross-section view of phase-shift mechanisms 308 taken along cross-sectional line II-II' of FIG. 3. In another example, FIG. 9 may be a cross-section of phase-shift mechanisms 312.

In the illustrative example of FIG. 9, the phase-shift mechanism 900 comprises one or more heating elements 902 (e.g., resistive heaters, or the like) that can be operated to change the temperature of a waveguide 904. Waveguide 904 may be implemented as the waveguide forming branch 306 in the example of FIG. 3, as the waveguide forming resonator cavity 310, or any waveguide disclosed therein. The heating element 902 may be, for example, a resistor (e.g., metal component) electrically coupled to a portion or all of waveguide 904. A current may then be applied to the heating elements 902 via contact electrode 906, which generates heat transferred to the respective waveguide 904 causing a change in temperature. Control of the current may tune the temperature so to tune the phase and/or resonant frequency. A change in phase or phase shift (0.4) of the waveguide can be induced based on a change in temperature as follows:

$$\Delta\varphi = \frac{2\pi L_H}{\lambda_0} \frac{dn}{dT} \Delta T \qquad \text{Eq. 6}$$

Where $L_H$ is a length of the heating element coupled to the respective waveguide, do/dT is a thermo-optic coefficient dependent on the material from which the respective waveguide is formed (e.g., indicative of a change in refractive index with the response to temperature), ΔT is the change in temperature of the respective waveguide, and $\lambda_o$ is the free space wavelength of the light. Thus, applying or subtracting heat from the respective waveguide 904 will induce a change in phase.

FIG. 9 also depicts a BOX layer 908 grown on a substrate (not shown). A layer 910 of semiconductor material is formed on the BOX layer 602, which may be a silicon layer or layer of other Group IV materials. The semiconductor material layer 910 comprises waveguide 904 and passivation layer 912 formed thereon. The passivation layer 912 may be formed for silicon dioxide ($SiO_2$) or similar material as desired for the particular application.

Figure 10A:
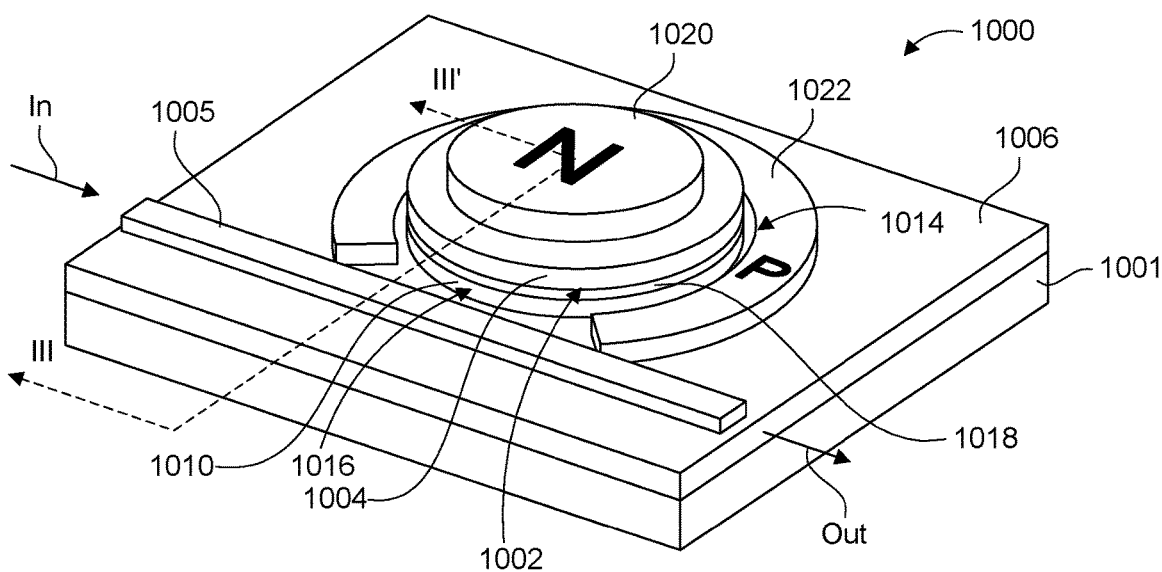
FIGS. 10A and 10B illustrate an example phase-shift mechanism comprising a metal oxide semiconductor capacitor (MOSCAP) according to implementations of the present disclosure.
Figure 10B:
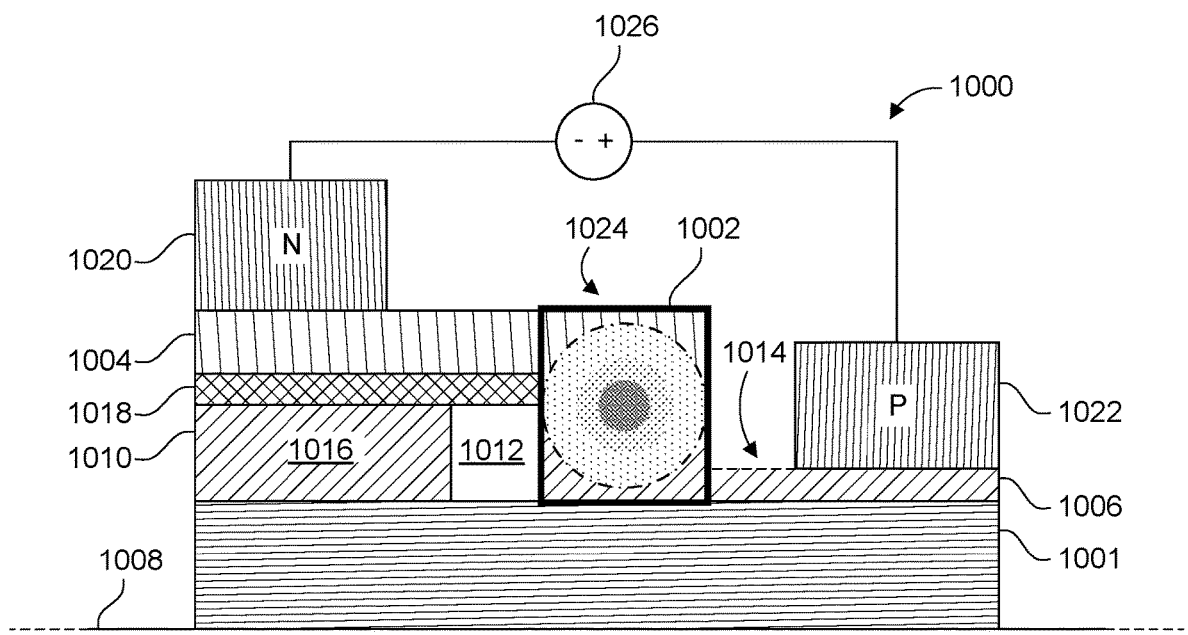

FIGS. 10A and 10B illustrate another example implementation of a phase-shift mechanism according to implementations of the present disclosure. FIGS. 10A and 10B illustrate an example hybrid MOS ring-resonator optical modulator 1000 that may be implemented as a phase-tuning mechanism, for example, one or more of phase-shift mechanisms 308 and 312 of FIG. 3. FIG. 10A is a perspective view of the optical modulator 1000 and FIG. 10B is a section view of the hybrid MOS optical modulator 1000 taken along a line A-A' shown in FIG. 10A.

The optical modulator 1000 includes an optical waveguide 1002, a cathode 1004 comprising a first material and formed in the optical waveguide 1002, and an anode 1006 comprising a second material that is different from the first material and formed in the optical waveguide 1002. The anode adjoins the cathode. A capacitor is defined between the anode and the cathode.

In some examples, a substrate 1001 comprises oxide grown on an underlying layer 1008. A silicon layer 1010 is formed on the substrate 1001. A trench 1012 separates the optical modulator 1000 into two portions 1014 and 1016. The first portion 1014 comprises the anode 1006. The optical waveguide 1002 is formed in the anode 1006. The cathode 1004 is integrated to the second portion 1016. The optical waveguide 1002 may be, for example, evanescently coupled to branch 306 in the case of phase-shift mechanism 308 and/or the waveguide of resonator cavity 310 in the case of phase-shift mechanism 312. In various embodiments, the cathode 1004 comprises a layer of Group III-V material as the first material. A MOS capacitor 1024 is defined between the cathode 1004 and the anode 1006.

A dielectric 1018 is formed between the cathode 1004 and the anode 1006. The dielectric 1018 may be an electrically insulating material formed between the cathode 1004 and anode 1006 of the MOS capacitor 1024, and the polarization of the dielectric 1018 by an applied electric field may increase the surface charge of the MOS capacitor 1024 for a given electric field strength. The dielectric 1018 can be native oxides of the cathode or the anode or both, or can be external dielectric materials such as high-k dielectrics or polymers which can be formed by deposition, oxidation, wafer bonding or other dielectric coating methods.

The cathode 1004 may comprise negatively-doped Group III-V material (such as GaAs, AlGaAs, or the like) and the anode 1006 may comprise positively-doped silicon. A cathode electrode 1020 is disposed on the cathode 1004 and an anode electrode 1022 is disposed on the anode 1006. When a voltage is applied between the electrodes, carrier accumulation, depletion or inversion can occur around dielectric 1018. Due to the capacitor region overlapping with the optical waveguide, carrier concentration change may lead to changes in refractive index and propagation loss within waveguide 1002. By biasing the voltage applied between the electrodes, the refractive index may be modulated accordingly, thereby inducing optical intensity modulation, phase shift modulation, and attenuation.

In a case where modulator 1000 is implemented as phase-shift mechanism 308, light may be evanescently coupled into the optical waveguide 1002 from a waveguide of branch 306 (e.g., at least a portion of light propagating in branch 306 is transferred into the optical waveguide 1002). In a case where modulator 1000 is implemented as phase-shift mechanism 312, light may be evanescently coupled into the optical waveguide 1002 from a waveguide of resonator cavity 310. In each such implementation, light propagating through optical waveguide 1002 is modulated, attenuated, and phase shifted based changes in the waveguide modal refractive index induced by biasing of the MOS capacitor 1024. A portion of the modulated and attenuated light can evanescently couple from the optical waveguide 1002 into another waveguide 1005. The other waveguide 1005 may be implemented as branch 306 (in the case of optical modulator 1000 being implemented as phase-shift mechanism 308) and/or waveguide of resonator cavity 310 (in the case of optical modulator being implemented as phase-shift mechanism 312).

For example, FIG. 10B includes a DC power source 1026. The DC power source 1026 acts as a signal source and has a negative terminal connected to the cathode electrode 1020 and a positive terminal connected the anode electrode 1022. This results in a migration of negative charges from the cathode 1004 toward a side of the optical waveguide 1002 adjacent to the cathode 1004, and migration of positive charges ("holes") from the anode 1006 to an opposite side of the waveguide 1002 (also referred to herein as accumulation mode). In other examples the polarity of the DC power source 1026 may be reversed. Reversing the polarity of the DC power source 1026 causes a migration of negative charges from the waveguide 1002 toward cathode electrode 1020, and migration of holes from the waveguide 1002 toward anode electrode 1022 (also referred to herein as depletion mode).

The MOS capacitor 1024 forms at the boundary between the Group III-V material of the cathode 1004 and the underlying capacitor portion of the intrinsic silicon or other Group IV material. A thin layer of silicon and the Group III-V oxides (e.g., dielectric 1018) forms naturally at this boundary and serves as a dielectric for the capacitor. In some examples, this thin layer has a thickness on a nanoscale, for example, a few nanometers thick. In some examples, steps need not be taken to encourage the formation of dielectric 1018. In other examples, the formation of dielectric 1018 may be stimulated, for example by elevating the temperature, exposing the materials to an oxygen-rich atmosphere, or other suitable technique.

As discussed previously, the MOS capacitor 1024 is formed inside the optical waveguide 1002 so that charge carriers that accumulate/deplete on either side of the capacitor dielectric have the effect of changing the index of refraction of the optical waveguide and waveguide loss (e.g., loss or attenuation of propagated signal power in the waveform).

The MOS capacitor 1024 can operate in accumulation, depletion or inversion mode (e.g., accumulation of electrons at the dielectric layer in addition to presence of holes). As discussed above, a DC voltage can be applied between an anode and cathode, causing a thin charge layer to accumulate, deplete, or invert on both sides of the dielectric layer 1018. The resulting change in free carrier density causes a change in refractive index n of the optical waveguide 1002, which is manifested as a change in the effective refractive index of the optical mode ($\Delta n_{eff}$). The amount of change or modulation in the effective refractive index ($\Delta n_{eff}$) and associated change in optical losses (La) can be described with as follows:

$$\Delta n_{eff} = \frac{-q^2 \lambda_0^2}{8\pi^2 c^2 n\varepsilon_0} \left( \frac{\Delta N_e}{m_{ce}^*} + \frac{\Delta N_h}{m_{ch}^*} \right) \quad \text{Eq. 7}$$

$$\Delta \alpha = \frac{-q^3 \lambda_0^2}{4\pi^2 c^3 n\varepsilon_0} \left( \frac{\Delta N_e}{m_{ce}^{*2} \mu_e} + \frac{\Delta N_h}{m_{ch}^{*2} \mu_h} \right) \quad \text{Eq. 8}$$

Where q is electrical charge applied to the cathode 1004 and the anode 1006, c is the speed of light in vacuum, Co is the permittivity of free space, n is the material refractive index, LN represents a change in carrier density such that Lk represents the change in carrier density in terms of electrons that Lk represents the change in carrier density in terms of holes, m* represents the relative effective mass of electrons ($m^*_{ce}$) and holes ($m^*_{ch}$), $\mu_h$ represents the hole mobility, $\mu_e$ represents the electron mobility, and $\lambda_0$ is the free space wavelength.

An optical phase shift (app) at the end of the capacitor depends on the magnitude of the voltage-induced $\Delta n_{eff}$, the device length L, and the optical wavelength $\lambda$. In this example, the optical phase shift can be calculated as $\Delta\varphi = 2\pi \Delta n_{eff} L \lambda$. Thus, the optical phase of the light within optical waveguide 1002 may be shifted based on the voltage-induced $\Delta n_{eff}$. In various examples, the waveguide loss in silicon and the Group III-V material may also change simultaneously as carrier density changes, and control of the change in the waveguide loss can be used as an optical attenuator. For example, changes in waveguide loss may be controlled based on the change in carrier density, which may impart attenuation of the waveguide losses. The attenuated waveguides losses can be used to modulate a signal.

As shown in FIG. 10A, the optical modulator 1000 may be a ring resonator optical modulator. In this case, trench 1012, shown in FIG. 10B, is provided as an annular trench that divides the optical modulator into first and second portions 1014 and 1016, respectively. Similarly, the anode 1006 is provided as an annular-shaped anode in the second portion and the cathode 1004, dielectric 1018, and the silicon layer 1010 are cylindrical in shape in the first portion. The MOS capacitor 1024 is defined across a boundary between the cathode and the anode.

As described above, the depletion or accumulation of charges at the interfacial layer results in a change of free carrier density that changes the local refractive index of the waveguide 1002. As described above, with reference to FIGS. 3-5G, the change in the refractive index of waveguide 1002 may be used to induce a phase shift (e.g., offset the phase) of light propagating in waveguide 1002. When used as a phase-shift mechanism 308, the phase-shift based on a voltage bias to the MOSCAP 1024 may be used to tune relative phase difference between an optical signal propagating in branch 306 and that in branch 304. As described above in relation to FIGS. 5A-5G, tuning the relative phase difference between branch 306 and branch 304 may configure the activation device 300 between different activation functions. When used as phase-shift mechanism 312, the phase-shift based on a voltage bias to the MOSCAP 1024 may be used to tune the resonance frequency of resonator cavity 310. Controlled tunning of the resonance frequency of resonator cavity 310 can be used to configure the activation device 300 between different activation functions, as described above in connection with FIGS. 5A-5G.

FIG. 11 illustrates an example computing component that may be used to operate a nonlinear activation function in accordance with various embodiments. Referring now to FIG. 11, computing component 1100 may be, for example, a server computer, a controller, or any other similar computing component capable of processing data. In the example implementation of FIG. 11, the computing component 1100 includes a hardware processor 1102, and machine-readable storage medium for 1104.

Hardware processor 1102 may be one or more central processing units (CPUs), semiconductor-based microprocessors, and/or other hardware devices suitable for retrieval and execution of instructions stored in machine-readable storage medium 1104. Hardware processor 1102 may fetch, decode, and execute instructions, such as instructions 1106-1110, to control processes or operations for operating a nonlinear activation function, such as those described in connection with FIGS. 2-4D. As an alternative or in addition to retrieving and executing instructions, hardware processor 1102 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 1104, may be any electronic, magnetic, optical, or other physical storage device that contains or stores executable instructions. Thus, machine-readable storage medium 1104 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 1104 may be a non-transitory storage medium, where the term "non-transitory" does not encompass transitory propagating signals. As described in detail below, machine-readable storage medium 1104 may be encoded with executable instructions, for example, instructions 1106-1110.

Hardware processor 1102 may execute instruction 1106 to control a first phase-shift mechanism coupled to a first branch of an interferometer to adjust a first bias of the interferometer to tune a phase difference between the first branch and a second branch of the interferometer. For example, the interferometer may be implemented as MZI 302 and the first phase-shift mechanism implemented as phase-shift mechanism 308 of FIG. 3. As described above, the phase-shift mechanism 308 can be controlled to tune a phase difference between branch 306 and branch 304, so to convert a nonlinear phase to a nonlinear response that is transmitted via an output of the MZI 302.

Hardware processor 1102 may execute instruction 1108 to control a second phase-shift mechanism of a resonator cavity, coupled to the second branch of the interferometer, to adjust a second bias of the resonator cavity such that the nonlinear activation device functions at approximately a resonance frequency of the resonator cavity. For example, the resonator cavity may be implemented as resonator cavity 310 of FIG. 3 and the second phase-shift mechanism implemented as phase-shift mechanism 312. As described above, the phase-shift mechanism 312 may be controlled to tune the resonance frequency of the resonator cavity 310, thereby providing a nonlinearity, which is converted by the phase-shift mechanism 312.

Hardware processor 1102 may execute instruction 1110 to tune a voltage bias applied to a semiconductor optical amplifier (SOA) coupled to an output of the interferometer based on the phase difference between first branch and the second branch of the interferometer to tune an amplitude of the output of the interferometer. The SOA may be implemented as one of SOA 326 or SOA 600, on which a voltage bias can be applied and controlled to add gain to the output of the MZI 302. Control of the voltage bias may be used to tune the amplitude of the output from the MZI 302, which can be implemented to normalize an amplitude of a desired activation function (e.g., as selected according to tuning of the first and second bias), as described above in connection with FIGS. 6-8.

Accordingly, as described above with reference to FIGS. 3-5G, the first and second biases can be individually and separately controlled by adjusting the bias within the all-optical activation device so as to achieve a desired activation function. For example, phase-shift mechanism 308 and/or 312 may be controlled to set the first and second bias to a first condition to achieve a first activation function (for example, ReLu function of FIG. 5A). Then one or more of the phase-shift mechanisms 308 and/or 312 can be tuned to adjust one or more of the first and second bias to a second condition to achieve a second activation function (for example, radial-basis activation function of FIG. 5E, cosine-like activation function of FIG. 5F, Sigmoid-like activation function of FIG. 5G, etc.). The voltage bias can be controlled to normalize the output optical power for each activation function so to add optical gain that provides a normalized optical power based on the desired activation function.

Figure 12:
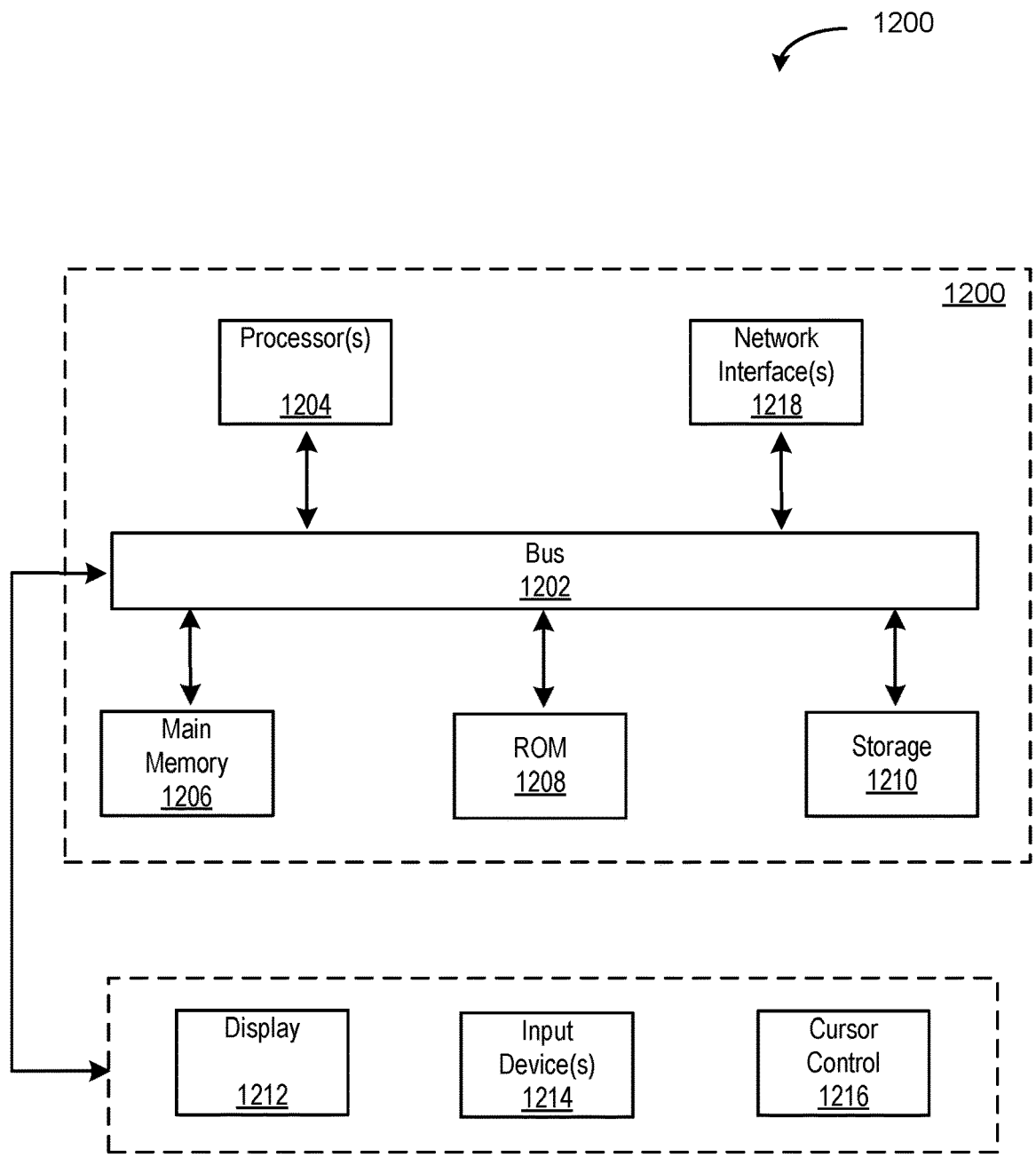
FIG. 12 is an example computer system that may be used to implement various features of all-optical nonlinear activation devices of the present disclosure.

FIG. 12 depicts a block diagram of an example computer system 1200 in which various of the embodiments described herein may be implemented. The computer system 1200 may be implemented, for example, to control one or more of the phase-shift mechanisms 308 and/or 312 and/or power source 636 and includes a bus 1202 or other communication mechanism for communicating information, one or more hardware processors 1204 coupled with bus 1202 for processing information. Hardware processor(s) 1204 may be, for example, one or more general purpose microprocessors.

The computer system 1200 also includes a main memory 1206, such as a random access memory (RAM), cache and/or other dynamic storage devices, coupled to bus 1202 for storing information and instructions (e.g., instructions 1106-1110) to be executed by processor 1204. Main memory 1206 also may be used for storing temporary variables or other intermediate information during execution of instructions to be executed by processor 1204. Such instructions, when stored in storage media accessible to processor 1204, render computer system 1200 into a special-purpose machine that is customized to perform the operations specified in the instructions.

The computer system 1200 further includes a read only memory (ROM) 1208 or other static storage device coupled to bus 1202 for storing static information and instructions for processor 1204. A storage device 1210, such as a magnetic disk, optical disk, or USB thumb drive (Flash drive), etc., is provided and coupled to bus 1202 for storing information and instructions.

The computer system 1200 may be coupled via bus 1202 to a display 1212, such as a liquid crystal display (LCD) (or touch screen), for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. In some embodiments, the same direction information and command selections as cursor control may be implemented via receiving touches on a touch screen without a cursor.

The computing system 1200 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1200 may implement the techniques described herein using customized hard-wired logic, one or more ASICs or FPGAs, firmware and/or program logic which in combination with the computer system causes or programs computer system 1200 to be a special-purpose machine. According to one embodiment, the techniques herein are performed by computer system 1200 in response to processor(s) 1204 executing one or more sequences of one or more instructions contained in main memory 1206. Such instructions may be read into main memory 1206 from another storage medium, such as storage device 1210. Execution of the sequences of instructions contained in main memory 1206 causes processor(s) 1204 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1210. Volatile media includes dynamic memory, such as main memory 1206. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1202. Transmission media can also take the form of acoustic or light waves, such as those generated during radio-wave and infra-red data communications.

The computer system 1200 also includes a communication interface 1218 coupled to bus 1202. Network interface 1218 provides a two-way data communication coupling to one or more network links that are connected to one or more local networks. For example, communication interface 1218 may be an integrated services digital network (ISDN) card, cable modem, satellite modem, or a modem to provide a data communication connection to a corresponding type of telephone line. As another example, network interface 1218 may be a local area network (LAN) card to provide a data communication connection to a compatible LAN (or WAN component to communicated with a WAN). Wireless links may also be implemented. In any such implementation, network interface 1218 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 1218, which carry the digital data to and from computer system 1200, are example forms of transmission media.

The computer system 1200 can send messages and receive data, including program code, through the network (s), network link and communication interface 1218. In the Internet example, a server might transmit a requested code for an application program through the Internet, the ISP, the local network and the communication interface 1218.

The received code may be executed by processor 1204 as it is received, and/or stored in storage device 1210, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways.

Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computer processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1200.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A nonlinear activation device, comprising:
   an interferometer comprising a first branch formed of a first waveguide and a second branch formed of a second waveguide;
   a resonator cavity coupled to the first waveguide;
   at least one phase-shift mechanism coupled to one of the second waveguide and the resonator cavity, the at least one phase-shift mechanism configured to control biases of the interferometer to achieve a desired activation function at an output of the interferometer; and an optical amplification mechanism coupled to the output of the interferometer and configured to add optical gain to the desired activation function, wherein the optical amplification mechanism comprises:
  a cathode formed on a third waveguide coupled to the output of the interferometer;
  a mesa structure formed on the cathode, the mesa structure comprising an optically active medium; and
  an anode formed on the mesa structure,
  wherein the cathode is formed between the third waveguide and the anode, and
  wherein the optically active medium emits light based on a bias applied between the cathode and the anode.

2. The nonlinear activation device of claim 1, wherein the first waveguide and the second waveguide are formed of silicon.

3. The nonlinear activation device of claim 1, wherein the resonator cavity comprises a fourth waveguide formed of silicon.

4. The nonlinear activation device of claim 1, wherein the at least one phase-shift mechanism comprises a first phase-shift mechanism and a second-phase shift mechanism, wherein the first phase-shift mechanism is coupled to the resonator cavity and the second phase-shift mechanism is coupled to the second waveguide of the interferometer.

5. The nonlinear activation device of claim 4, wherein the resonator cavity comprises a nonlinearity configured to provide input power-dependent transmission and phase of an optical signal output from the resonator cavity, and wherein the second phase-shift mechanism is configured to tune a phase difference between an optical signal in the first branch and an optical signal in the second branch to achieve the desired activation function.

6. The nonlinear activation device of claim 1, wherein the at least the one phase-shift mechanism comprises one or more of a heterogeneous metal oxide semiconductor (MOS) phase shifter and a heater.

7. The nonlinear activation device of claim 1, wherein the optically active medium comprises one or more of quantum dots, quantum wells, and quantum-dash structures.

8. The nonlinear activation device of claim 1, wherein the mesa structure comprises a Group III-V material.

9. The nonlinear activation device of claim 1, further comprising:
  an optical splitter coupled to an input of the interferometer and configured couple an input optical signal into the first branch and second branch based on a fixed splitting ratio.

10. The nonlinear activation device of claim 1, wherein the second waveguide comprises a resonator cavity-less waveguide.

11. An optical device, comprising:
  a Mach-Zehnder interferometer (MZI) comprising a first branch and a second branch;
  a microring resonator (MRR) coupled to the first branch;
  a first phase-shift mechanism coupled to the MRR configured to tune a resonance frequency of the MRR;
  a second phase-shift mechanism coupled to the second branch, the second phase-shift mechanism configured to control biases of the MZI to tune optical interference between optical signals propagating in the first and second branches; and
  an optical amplification mechanism coupled to an output of the MZI and configured to add optical gain to an output of the MZI, wherein the optical amplification mechanism comprises:
    a cathode formed on a waveguide coupled to the output of the interferometer;
    a mesa structure formed on the cathode, the mesa structure comprising an optically active medium; and
    an anode formed on the mesa structure,
    wherein the cathode is formed between the waveguide and the anode, and
    wherein the optically active medium emits light based on a bias applied between the cathode and the anode.

12. The optical device of claim 11, wherein the MZI and the MRR comprise silicon waveguides.

13. The optical device of claim 11, wherein the MRR comprises a nonlinearity configured to provide input power-dependent transmission and phase of an optical signal output from the MRR, and wherein the second phase-shift mechanism is configured to tune a phase difference to achieve a desired activation function from a plurality of activation functions.

14. The optical device of claim 11, wherein the first and second phase-shift mechanisms comprise one or more of a heterogeneous metal oxide semiconductor (MOS) phase shifter and a heater.

15. The optical device of claim 11, wherein the optically active medium comprises one or more of quantum dots, quantum wells, and quantum-dash structures.

16. The optical device of claim 11, wherein the mesa structure comprises a Group III-V material.

17. A method for operating a nonlinear activation device, the method comprising:
  adjusting a first bias of an interferometer included in the nonlinear activation device by controlling a first phase-shift mechanism coupled to a first branch of the interferometer to tune a phase difference between the first branch and a second branch of the interferometer;
  adjusting a second bias of a resonator cavity, coupled to a second branch of the interferometer, such that the nonlinear activation device functions at approximately a resonance frequency of the resonator cavity by controlling a second phase-shift mechanism coupled to the resonator cavity;
  tuning a voltage bias applied to a semiconductor optical amplifier coupled to an output of the interferometer based on the phase difference between the first branch and the second branch of the interferometer to tune an amplitude of the output of the interferometer,
  wherein the first and second bias are controlled to achieve a desired activation function; and
  switching between a first activation function and the desired activation function by tuning one or more of the first and second bias,
  wherein the voltage bias applied to the semiconductor optical amplifier is tuned so that an amplitude of an optical power output by the semiconductor optical amplifier for the desired activation function is approximately equal to an amplitude of an optical power output by the semiconductor optical amplifier for the first activation function.

* * * * *